United States Patent
Kato

(10) Patent No.: US 8,507,902 B2
(45) Date of Patent: Aug. 13, 2013

(54) SEMICONDUCTOR DEVICE

(75) Inventor: Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 236 days.

(21) Appl. No.: 13/096,094

(22) Filed: Apr. 28, 2011

(65) Prior Publication Data

US 2011/0222336 A1   Sep. 15, 2011

Related U.S. Application Data

(62) Division of application No. 11/791,615, filed as application No. PCT/JP2005/021747 on Nov. 21, 2005, now Pat. No. 7,960,719.

(30) Foreign Application Priority Data

Dec. 3, 2004   (JP) .................................. 2004-351096

(51) Int. Cl.
   *H01L 35/24*   (2006.01)

(52) U.S. Cl.
   USPC .................................... 257/40; 257/E51.001

(58) Field of Classification Search
   USPC ........................................... 257/40, E51.001
   See application file for complete search history.

(56) References Cited

U.S. PATENT DOCUMENTS

| | | | |
|---|---|---|---|
| 5,972,156 A | 10/1999 | Brady et al. | |
| 6,078,259 A | 6/2000 | Brady et al. | |
| 6,121,083 A | 9/2000 | Matsuki | |
| 6,420,741 B1 | 7/2002 | Nakajima | |
| 6,423,999 B1 | 7/2002 | Matsuki | |
| 6,429,089 B1 | 8/2002 | Matsuki | |
| 6,646,912 B2 | 11/2003 | Hurst et al. | |
| 6,847,541 B2 | 1/2005 | Tsujioka | |
| 6,947,321 B2 | 9/2005 | Tanabe | |

(Continued)

FOREIGN PATENT DOCUMENTS

| EP | 1039476 A | 9/2000 |
|---|---|---|
| EP | 1265287 A | 12/2002 |

(Continued)

OTHER PUBLICATIONS

International Search Report (Application No. PCT/JP2005/021747) dated Feb. 28, 2006.

(Continued)

*Primary Examiner* — Anthony Ho
(74) *Attorney, Agent, or Firm* — Eric J. Robinson; Robinson Intellectual Property Law Office, P.C.

(57) ABSTRACT

The invention provides a semiconductor device where data can be written after the production and forgery caused by rewriting of data can be prevented, and which can be manufactured at a low cost using a simple structure and an inexpensive material. Further, the invention provides a semiconductor device having the aforementioned functions, where wireless communication is not blocked by the internal structure. The semiconductor device of the invention has an organic memory provided with a memory cell array including a plurality of memory cells, a control circuit for controlling the organic memory, and a wire for connecting an antenna. Each of the plurality of memory cells has a transistor and a memory element. The memory element has a structure where an organic compound layer is provided between a first conductive layer and a second conductive layer. The second conductive layer is formed in a linear shape.

29 Claims, 14 Drawing Sheets

(56) References Cited

U.S. PATENT DOCUMENTS

| | | | |
|---|---|---|---|
| 7,027,327 B2 | 4/2006 | Yamamoto et al. |
| 7,253,433 B2 | 8/2007 | Ishida et al. |
| 7,518,692 B2 | 4/2009 | Yamazaki et al. |
| 7,781,758 B2 | 8/2010 | Abe et al. |
| 7,795,617 B2 | 9/2010 | Koyama et al. |

FOREIGN PATENT DOCUMENTS

| | | |
|---|---|---|
| EP | 1 381 054 | 1/2004 |
| EP | 1437683 A | 7/2004 |
| JP | 02-239664 A | 9/1990 |
| JP | 11-068041 A | 3/1999 |
| JP | 2000-269446 A | 9/2000 |
| JP | 2001-189431 A | 7/2001 |
| JP | 2003-036684 A | 2/2003 |
| JP | 2003-229538 A | 8/2003 |
| JP | 2004-047791 | 2/2004 |
| JP | 2004-064062 A | 2/2004 |
| JP | 2004-128471 | 4/2004 |
| JP | 2004-220591 A | 8/2004 |
| KR | 0170560 B | 3/1999 |
| KR | 2004-0045462 A | 6/2004 |
| WO | WO-96/07938 | 3/1996 |
| WO | WO 03/052827 | 6/2003 |
| WO | WO 2004/015778 | 2/2004 |

OTHER PUBLICATIONS

Written Opinion (Application No. PCT/JP2005/021747) dated Feb. 28, 2006.

Office Action (Application No. 200580042933.6) dated Aug. 29, 2008.

Korean Office Action (Application No. 2007-7015261) Dated Nov. 17, 2011.

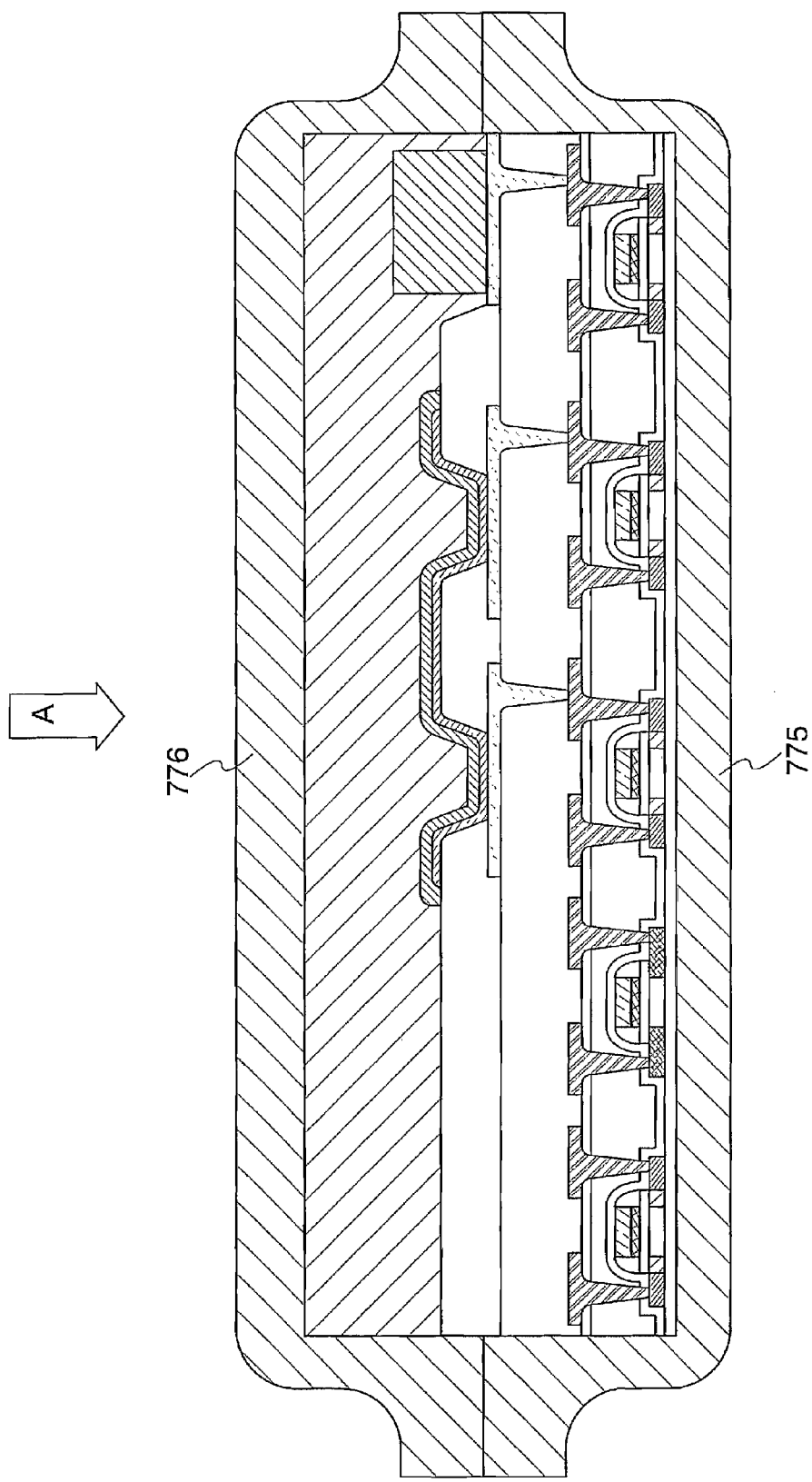

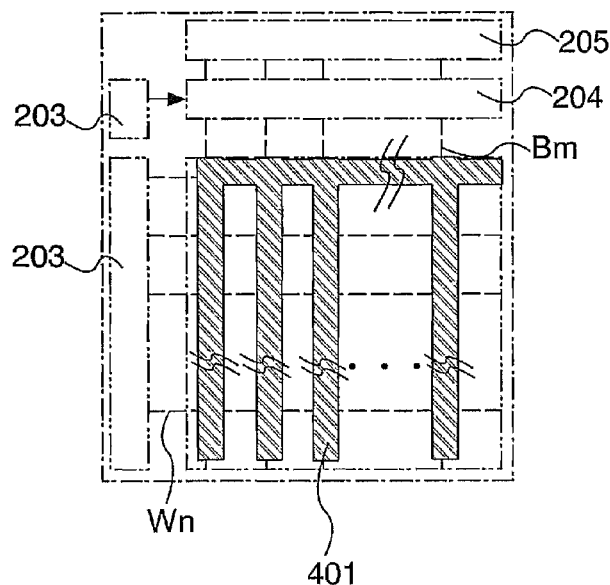
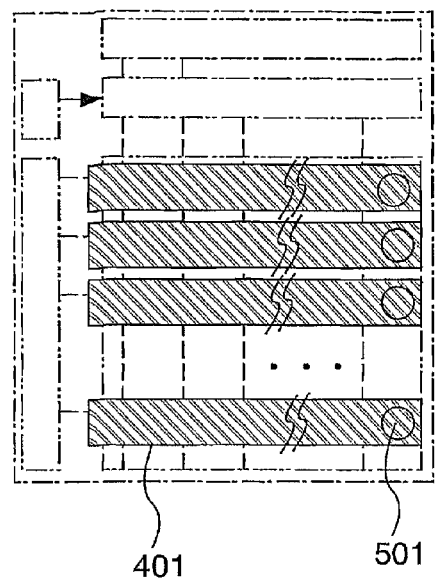
FIG. 5A  FIG. 5B
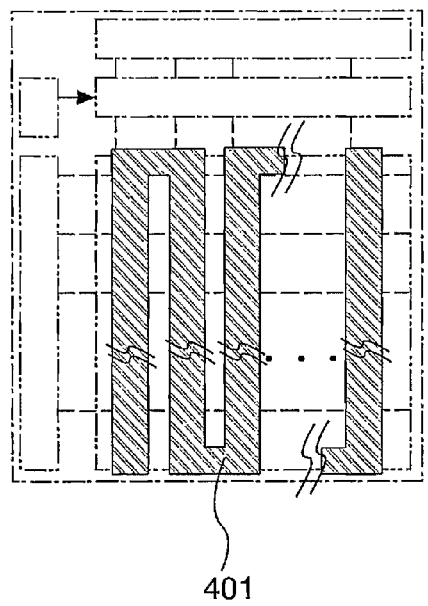
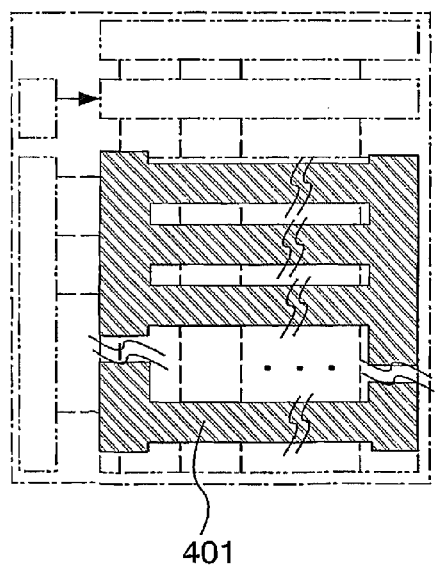
FIG. 5C  FIG. 5D

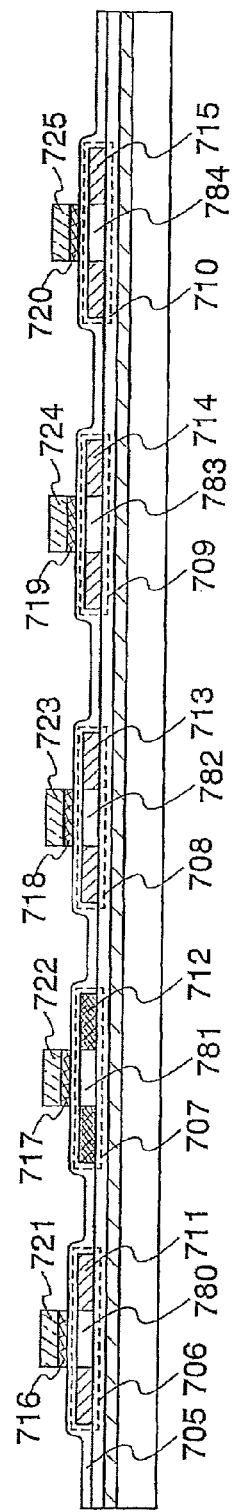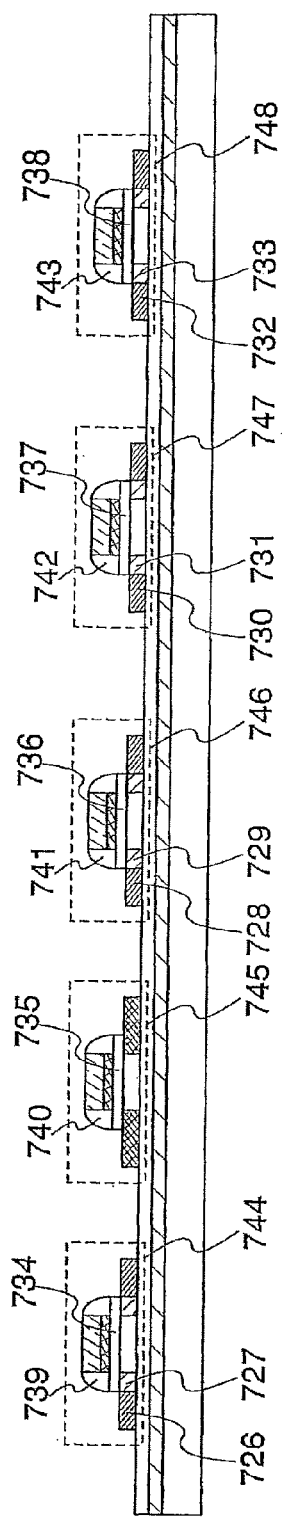

SEMICONDUCTOR DEVICE

TECHNICAL FIELD

The present invention relates to a semiconductor device capable of communicating data.

BACKGROUND ART

The invention relates to a semiconductor device, in particular a semiconductor device capable of communicating data wirelessly.

A semiconductor device capable of communicating data wirelessly is typified by a wireless chip. A wireless chip is used for production management by assigning an identification number (ID) to an object and storing the history thereof. A wireless chip assigned an ID (wireless tag) is also used for utilization and management of personal data, money and the like. Such a wireless chip is called an ID tag, an IC card or the like, and has been manufactured in quantity and widely used with development of identification technology and increase in demand.

Depending on the application, a wireless chip is changed in communication distance, communication method, size, the presence or absence of an internal power supply, configuration of an internal memory, and the like, For production management, demand for a small and lightweight wireless tag with a long communication distance has increased.

A wireless tag that has no internal power supply and operates with externally supplied power can be reduced in size and weight; however, the communication distance depends largely on circumstances, and in particular the presence or absence of a conductor around an antenna.

Since a wireless chip communicates data wirelessly, it involves a risk of interception of data and forgery of data. In addition, important data such as money or personal privacy is stored in a wireless chip in some cases, and it is thus necessary to improve the security of the stored data.

Accordingly, if a wireless chip incorporates a rewritable memory, some measures such as cryptographic security technology are required.

In order to prevent forgery of data, a memory (write-once memory) that can be written only once and cannot be rewritten may be incorporated.

In the case of incorporating a write-once memory, a wireless chip preferably incorporates a memory where data can be written after the production, particularly in the initial use rather than a memory such as a mask ROM where data can be written only during the production. As a result, an easy-to-use and high demand wireless chip can be achieved.

The frequency of use of the wireless chip has increased each year, and the wireless chip is required to be manufactured at lower cost.

In order to supply a wireless chip meeting users' demand, it is necessary to provide a small and lightweight wireless chip with a long communication distance, high security of data, and high usability, which can be manufactured at a low cost using an inexpensive material and a simple structure.

Many of wireless chips that have been put into practical use have a circuit (also called an IC: Integrated Circuit chip) using a semiconductor substrate such as a Si substrate as well as an antenna. The IC chip is constituted by a memory circuit (also called a memory), a control circuit and the like. These semiconductor devices are required to be manufactured at a low cost; therefore, in recent years, an organic TFT, an organic memory and the like, which use an organic compound for a control circuit, a memory circuit and the like, have been actively developed (see Japanese Patent Laid-Open No. 2004-47791 for example).

DISCLOSURE OF INVENTION

In view of the foregoing, the invention provides a semiconductor device capable of communicating data wirelessly, where data can be written after the production and forgery caused by rewriting of data can be prevented. The invention also provides a semiconductor device that can be manufactured at a low cost using a simple structure and an inexpensive material. Further, the invention provides a semiconductor device having the aforementioned functions, where wireless communication is not blocked by the internal structure.

The invention takes the following measures to solve the aforementioned problems.

A semiconductor device of the invention has an organic memory provided with a memory cell array including a plurality of memory cells, and a control circuit for controlling the organic memory. Each of the plurality of memory cells has a transistor and a memory element. The memory element has a structure where an organic compound layer is sandwiched between a first conductive layer and a second conductive layer having a linear shape.

A semiconductor device of the invention has an organic memory provided with a memory cell array including a plurality of memory cells, a control circuit for controlling the organic memory, and an antenna for supplying power to the control circuit. Each of the plurality of memory cells has a transistor and a memory element. The memory element has a structure where an organic compound layer is sandwiched between a first conductive layer and a second conductive layer having a linear shape.

A semiconductor device of the invention has an organic memory provided with a memory cell array including a plurality of memory cells, and a control circuit for controlling the organic memory. Each of the plurality of memory cells has a transistor and a memory element. The memory element has a structure where an organic compound layer is sandwiched between a first conductive layer and a second conductive layer having a linear shape. One or both of the first conductive layer and the second conductive layer transmit light.

A semiconductor device of the invention has an organic memory provided with a memory cell array including a plurality of memory cells, a control circuit for controlling the organic memory, and an antenna for supplying power to the control circuit. Each of the plurality of memory cells has a transistor and a memory element. The memory element has a structure where an organic compound layer is sandwiched between a first conductive layer and a second conductive layer having a linear shape. One or both of the first conductive layer and the second conductive layer transmit light.

In the aforementioned structures, the organic compound layer is an electron transporting layer or a hole transporting layer.

In the aforementioned structures, the organic compound layer is made of a material having a resistance that is changed by light irradiation, heating, or an electrical effect.

The semiconductor device of the invention has, in addition to the organic memory, one or more of a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Read Only Memory), and a flash memory. The organic memory may also be used as a DRAM, an FeRAM or the like depending on the material.

The semiconductor device of the invention has, in addition to the control circuit, ore or more of a power supply circuit, a clock generation circuit, a demodulation/modulation circuit, and an interface circuit.

In the invention, the organic memory and the control circuit may be formed over a glass substrate or a flexible substrate. Note that the organic memory and the control circuit may be formed over the same substrate or different substrates. If they are formed over the same substrate, production efficiency can be improved.

In the aforementioned structures, the control circuit may have a thin film transistor.

In this specification, the semiconductor device includes a wireless chip, a wireless tag, an electronic tag, an ID chip, an ID tag, an IC tag, an IC chip, an RF (Radio Frequency) tag, an RFID (Radio Frequency Identification) tag and the like.

The memory element of the invention is made of an organic compound having a resistance that is changed by light irradiation, heating, or an electrical effect. Thus, data can be written to the semiconductor device after the production thereof by light irradiation, heating, or an electrical effect, which results in an easy-to-use semiconductor device.

In addition, in the memory element of the invention, data writing (write-once) can only be enabled after the chip production; therefore, forgery caused by rewriting of data can be prevented and a semiconductor device with high security can be provided.

Further, the semiconductor device of the invention incorporates a memory having a memory element that uses a simple structure and an inexpensive material such as a glass substrate. Accordingly, an inexpensive semiconductor device can be provided.

In the internal structure of the semiconductor device of the invention, the second conductive film is formed in a linear shape. As a result, a semiconductor device with a long communication distance, where wireless communication is not blocked, can be provided.

BRIEF DESCRIPTION OF DRAWINGS

FIG. 3 is a cross sectional view showing a structure of a semiconductor device of the invention.

FIGS. 5A to 5D are diagrams each showing a semiconductor device of the invention.

FIGS. 9A to 9C are diagrams showing a semiconductor device of the invention.

BEST MODE FOR CARRYING OUT THE INVENTION

Figure 1A:
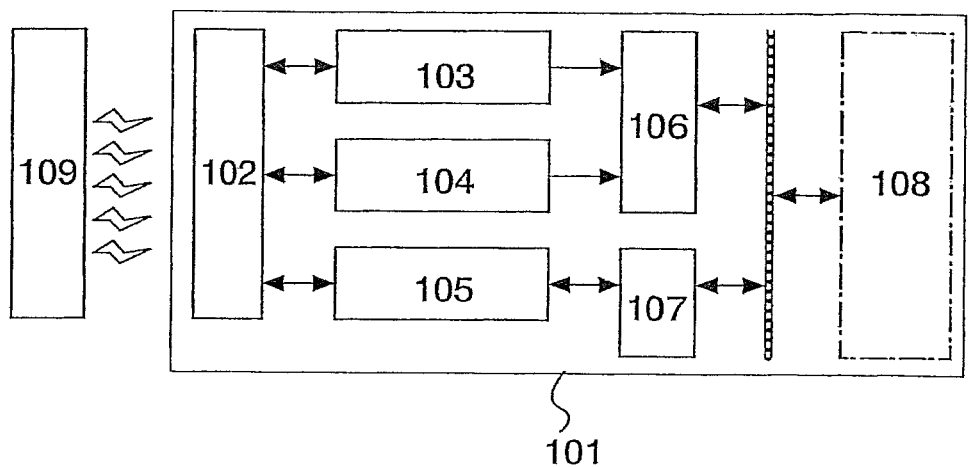
FIGS. 1A and 1B are diagrams each showing a semiconductor device of the invention.

Although the invention will be described by way of Embodiment Modes and Embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings for illustrating the invention, the identical portions are denoted by the identical reference numerals, and description thereof is omitted.

Embodiment Mode 1

Described in this embodiment mode is a configuration of a semiconductor device of the invention, which wirelessly communicates data with an external communication device (reader/writer) through an antenna.

Figure 1B:
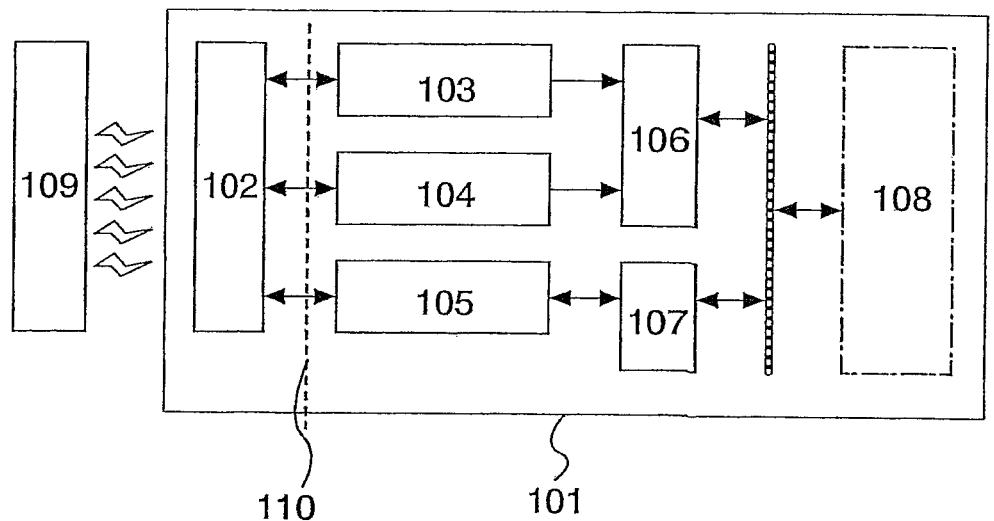

FIGS. 1A and 1B are schematic diagrams each showing a semiconductor device of the invention.

As shown in FIG. 1A, a semiconductor device 101 of the invention includes an antenna 102, a power supply circuit 103, a clock generation circuit 104, a demodulation/modulation circuit 105, a control circuit 106, an interface (IF) circuit 107, and a memory 108. The semiconductor device 101 can wirelessly communicate data with an external communication device (a reader/writer 109).

If the semiconductor device 101 is connected to the antenna 102 that is formed separately as shown in FIG. 1B, the semiconductor device 101 may have a wire 110 for connecting the antenna 102. If the semiconductor device 101 communicates data wirelessly, the wire 110 is connected to an antenna that is formed separately from the semiconductor device.

The power supply circuit 103 generates, in accordance with an AC signal input from the antenna 102, various power supplies to be supplied to each circuit in the semiconductor device 101. The clock generation circuit 104 generates, in accordance with an AC signal input from the antenna 102, various clock signals to be supplied to each circuit in the semiconductor device 101. The demodulation/modulation circuit 105 has a function of demodulating/modulating data to be communicated with the reader/writer 109. The control circuit 106 has a function of controlling the memory 108. The antenna 102 has a function of transmitting/receiving electromagnetic waves or radio waves. The reader/writer 109 communicates with and controls the semiconductor device 101 and controls the process related to data written therein.

The semiconductor device is not limited to the aforementioned configuration, and for example, other elements such as a congestion control circuit and an encryption circuit may be additionally provided.

The memory 108 of the invention has a layer containing an organic compound. In this specification, a layer containing an organic compound is referred to as an organic compound layer, and a memory having an organic compound layer is referred to as an organic memory.

An organic memory has an organic compound layer for a memory element, and stores data when the resistance of the organic compound layer is changed by light irradiation, heating, or an electrical effect.

When an organic compound having a resistance that is irreversibly changed is used for the organic compound layer in the memory element, a write-once memory is obtained. Meanwhile, when an organic compound having a resistance that is reversibly changed is used, a rewritable memory is obtained.

As the memory 108 incorporated in the semiconductor device 101 of the invention, only an organic memory may be provided or one or more of memories with other structures may be provided in addition to the organic memory.

Figure 14A:
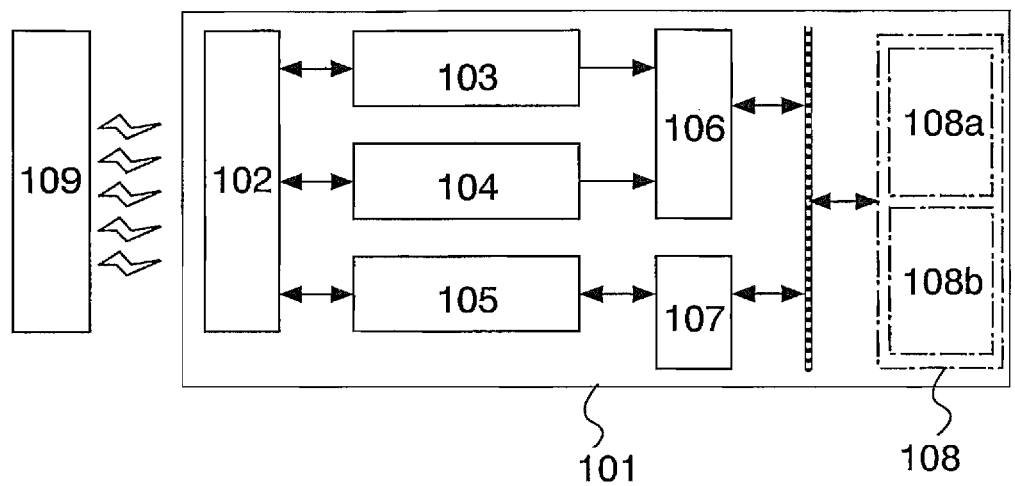
FIGS. 14A and 14B are diagrams each showing a semiconductor device of the invention.
Figure 14B:
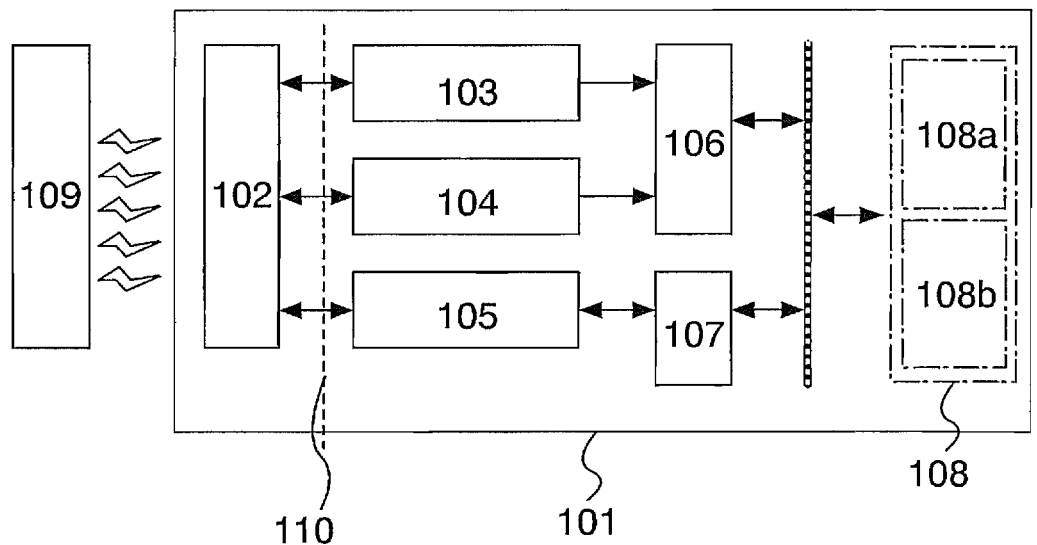

FIGS. 14A and 14B each shows a configuration of the semiconductor device 101 of the invention, where a memory 108b with another structure is additionally provided.

As shown in FIG. 14A, the semiconductor device 101 of the invention includes the antenna 102, the power supply circuit 103, the clock generation circuit 104, the demodulation/modulation circuit 105, the control circuit 106, the interface (I/F) circuit 107, and the memory 108 having an organic memory 108a and the memory 108b with another structure. The semiconductor device 101 can wirelessly communicate data with the external communication device (the reader/writer 109).

If the semiconductor device 101 is connected to the antenna 102 that is formed separately as shown in FIG. 14B, the semiconductor device 101 may have the wire 110 for connecting the antenna 102. If the semiconductor device 101 communicates data wirelessly, the wire 110 is connected to an antenna that is formed separately from the semiconductor device.

The power supply circuit 103 generates, in accordance with an AC signal input from the antenna 102, various power supplies to be supplied to each circuit in the semiconductor device 101. The clock generation circuit 104 generates, in accordance with an AC signal input from the antenna 102, various clock signals to be supplied to each circuit in the semiconductor device 101. The demodulation/modulation circuit 105 has a function of demodulating/modulating data to be communicated with the reader/writer 109. The control circuit 106 has a function of controlling the memory 108. The antenna 102 has a function of transmitting/receiving electromagnetic waves or radio waves. The reader/writer 109 communicates with and controls the semiconductor device 101 and controls the process related to data written therein.

The semiconductor device is not limited to the aforementioned configuration, and for example, other elements such as a congestion control circuit and an encryption circuit may be additionally provided.

The memory 108 of the invention has a layer containing an organic compound. In this specification, a layer containing an organic compound is referred to as an organic compound layer, and a memory having an organic compound layer is referred to as an organic memory.

The organic memory 108a has an organic compound layer for a memory element, and stores data when the resistance of the organic compound layer is changed by light irradiation, heating, or an electrical effect.

When an organic compound having a resistance that is irreversibly changed is used for the organic compound layer in the memory element, a write-once memory is obtained. Meanwhile, when an organic compound having a resistance that is reversibly changed is used, a rewritable memory is obtained.

The memory 108b with another structure is, for example, a DRAM (Dynamic Random Access Memory), an SRAM (Static Random Access Memory), an FeRAM (Ferroelectric Random Access Memory), a mask ROM (Mask Read Only Memory), a PROM (Programmable Read Only Memory), an EPROM (Electrically Programmable Read Only Memory), an EEPROM (Electrically Erasable Read Only Memory), or a flash memory; however, the invention is not limited to these examples. In addition, the semiconductor device may have one or more of memories with other configurations.

Figure 2A:
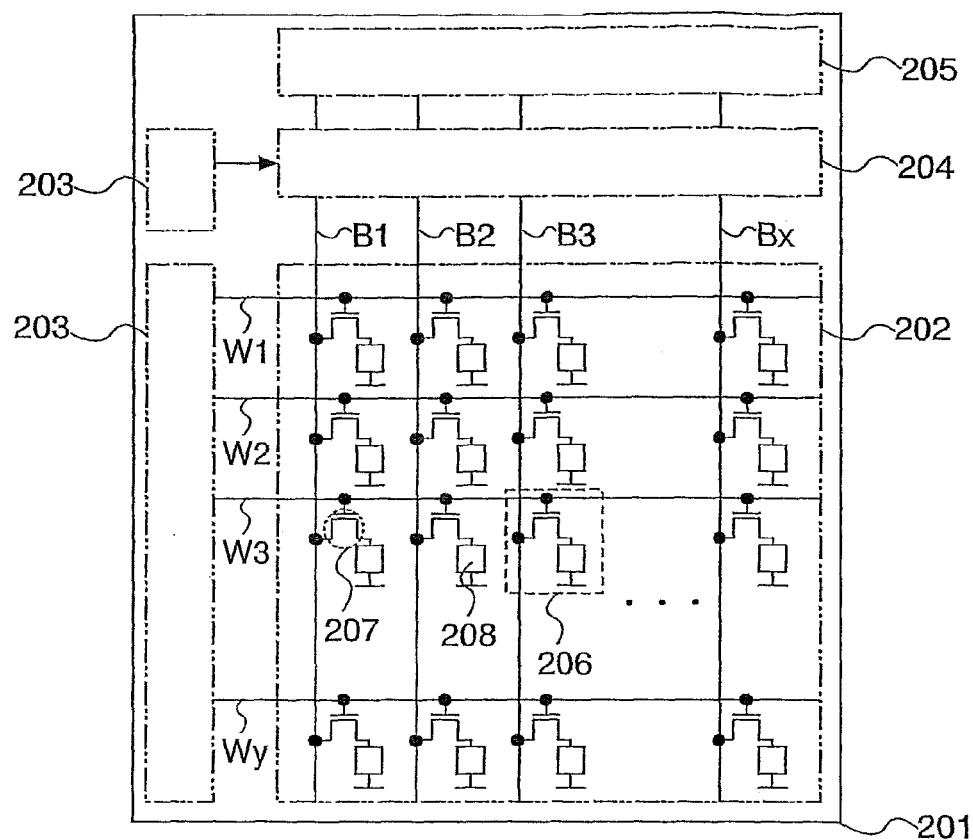
FIGS. 2A and 2B are diagrams showing a semiconductor device of the invention.

Next, a structure of an organic memory is shown in FIG. 2A.

An organic memory 201 has a memory cell array 202, decoders 203, a selector 204, and a reading/writing circuit 205.

A memory cell 206 of the organic memory 201 has a transistor 207 and a memory element 208.

The memory element 208 has a structure where an organic compound layer is sandwiched between a pair of conductive layers, namely a first conductive layer and a second conductive layer. The first conductive layer of the pair of conductive layers is connected to one of a source region and a drain region of the transistor 207 in the memory cell 206.

The second conductive layer of the pair of conductive layers may be an electrode for all the memory cells 206 in the organic memory 201. The second conductive layer supplies a common potential to one terminal of all the memory elements when the organic memory is operated (read or written), which is referred to as a common electrode in this specification.

Figure 2B:
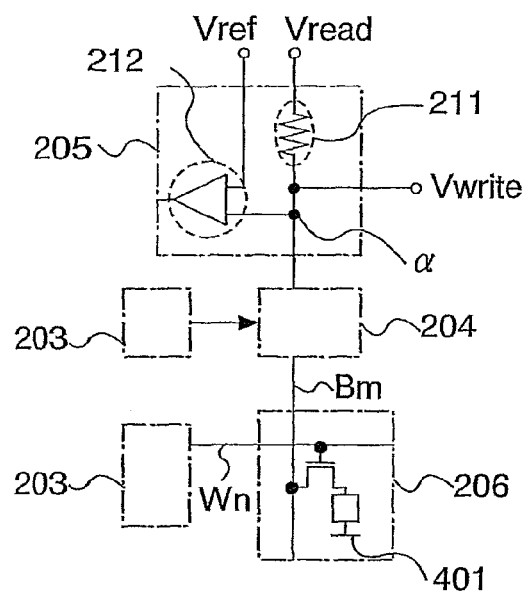

As shown in FIG. 2B, a bit line Bm (1=m=x) is connected to the source region or the drain region of the transistor 207 in the memory cell 206, which is not connected to the memory element 208, while a word line Wn (1=n=y) is connected to a gate electrode. In this manner, the memory cell array 202 is constituted by the memory cells 206 arranged in matrix.

Figure 4:
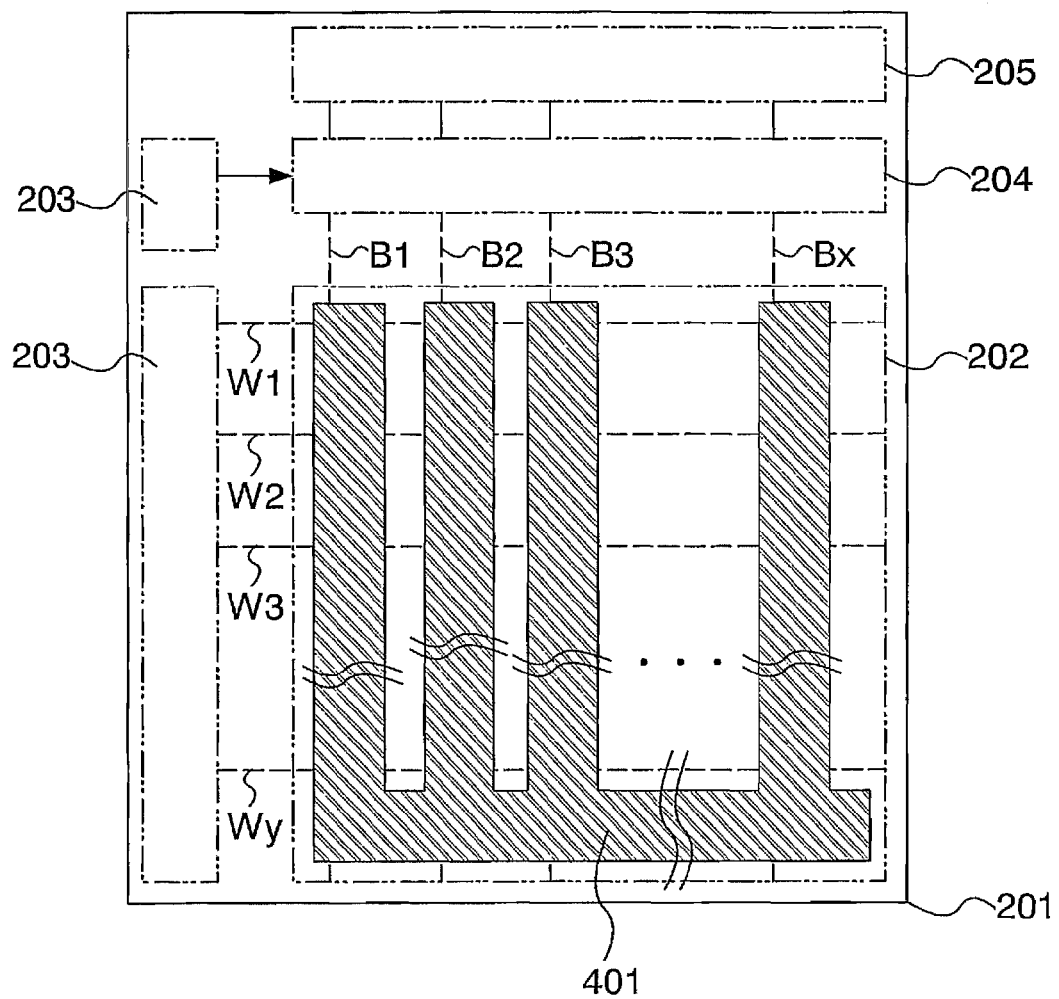
FIG. 4 is a diagram showing a semiconductor device of the invention.

Next, the second conductive layer, that is, the common electrode is described. FIG. 4 shows one example of a structure of an organic memory, which is seen from the top of a substrate, namely the direction of an arrow A of FIG. 3.

A common electrode 401 of all memory elements supplies a common potential to one terminal of all the memory elements. The common electrode 401 is formed in a linear shape as shown in FIG. 4. Note that the shape shown in FIG. 4 is just an example, and the linear shape is not limited to this.

If the semiconductor device transmits/receives data by an electromagnetic coupling system where data is communicated by mutual induction, or an electromagnetic induction system where data is communicated by the induction field, the communication distance is reduced when a high conductive material such as a metal is formed over a large planar surface around the antenna.

This is because eddy currents are generated in the high conductive material by electromagnetic waves emitted from the reader/writer, and the electromagnetic waves are absorbed; thus a sufficient amount of induced electromotive force cannot be generated in the semiconductor device.

When the common electrode is formed in a planar shape, electromagnetic waves emitted from the reader/writer are absorbed by the common electrode, and the communication distance of a wireless tag is reduced. The eddy currents generated in the common electrode increase the load of the reader/writer that operates the semiconductor device.

Thus, as shown in FIG. 4, the common electrode 401 is formed in a linear shape so that the absorption of electromagnetic waves is reduced. As a result, the communication distance is increased without blocking the communication of the wireless tag.

The linear shape herein means a rectangle with a second side much longer than a first side, an ellipse with a long axis, or a long shape similar to these. Since the common electrode supplies the same potential to one terminal of all the memory elements, rectangles or ellipses are preferably formed in a comb-like pattern as shown in FIG. 4 for example, which are included in the linear shape. However, the linear shape is not limited to the examples shown herein, and any of shapes that can reduce the absorption of electromagnetic waves caused by the aforementioned eddy currents may be adopted. Further, the common electrode 401 is only required to have a shape that can reduce the absorption of electromagnetic waves caused by the aforementioned eddy currents, and it is not required to be formed with high processing accuracy.

An operation of writing data to the organic memory 201 is described with reference to FIG. 2B.

First, an operation of writing data by an electrical effect is described. Explanation is made on the case where data is written to the memory cell 206 of the m-th column and the n-th row. In this case, the bit line Bm of the m-th column and the word line Wn of the n-th row are selected by the decoder 203 and the selector 204, and a voltage is applied to the gate electrode of the transistor 207 included in the memory cell 206 of the m-th column and the n-th row. Then, a predetermined voltage is applied to Vwrite and the common electrode 401 in FIG. 2B.

In general, the potential difference between Vwrite and the common electrode 401 is larger than that between Vread in reading and the common electrode 401. When a voltage is applied to Vwrite, no voltage is applied to Vread, and a circuit (not shown) is provided to prevent current from flowing in the opposite direction.

A voltage applied to the bit line Bm of the m-th column is transmitted to the first conductive layer of the memory element 208. When the voltage of the common electrode 401 is fixed lower than the voltage applied to the bit line Bm, a potential difference is generated between the first conductive layer and the second conductive layer. This potential difference changes the resistance value of the organic compound layer in the memory element 208, so that data can be written.

Next, an operation of writing data by an optical effect is described. In the case of writing data to the organic memory by an optical effect, one or both of the first conductive layer and the second conductive layer of the memory element transmit light so that the organic compound layer is irradiated with light from the side of the light transmissive conductive layer.

If an organic compound having a resistance that is increased by an optical effect is used as a material of the organic compound layer, the resistance value of the organic compound layer is increased by irradiation with light such as laser light.

Instead, a material having a resistance that is reduced by an optical effect may be used for the organic compound layer. For example, if a conjugated polymer material doped with a photoacid generator is used, the resistance value of the organic compound layer is reduced by irradiation with light such as laser light.

Laser irradiation is described as an example of an optical effect brought about on the organic compound layer. The resistance of the organic compound layer irradiated with laser light is changed, depending on the size of a memory cell, by irradiation with a laser beam with a diameter on the order of micrometers. For example, when a laser beam with a diameter of 1 μm passes at a linear rate of 10 m/sec, the organic compound layer included in one memory cell is irradiated with a laser beam for 100 nsec. In order to change the phase in periods as short as 100 nsec, a laser power may be set to 10 mW and a power density may be set to 10 kW/mm$^2$, for example. In addition, a pulsed laser is preferably used in the case where the organic compound layer is selectively irradiated with a laser beam.

As a laser irradiation apparatus, a laser oscillator capable of emitting ultraviolet light, visible light, or infrared light may be used. An example of the laser oscillator includes an excimer laser such as KrF, ArF, XeCl, and Xe, a gas laser such as He, He—Cd, Ar, He—Ne, and HF, a solid-state laser using a crystal such as YAG, GdVO$_4$, YVO$_4$, YLF, and YAlO$_3$ doped with Cr, Nd, Er, Ho, Ce, Co, Ti, or Tm, and a semiconductor laser using GaN, GaAs, GaAlAs, InGaAsP or the like. If the solid-state laser is used, it is preferable to use the fundamental wave or the second to fifth harmonics.

The writing operation described above is just an example. Data may be written to the organic memory by other methods such as heating a part of the organic compound layer of the memory element; however, the invention is not limited to these examples.

Next, an operation of reading data from the organic memory is described.

FIG. 2B shows an example of reading data by an electrical effect. In FIG. 2B, the reading/writing circuit 205 has a resistor 211 and a sense amplifier 212. However, the reading/writing circuit 205 is not limited to such a configuration, and may have any configuration.

Data is read by applying a voltage between the first conductive layer and the second conductive layer and reading the resistance value of the organic compound layer. In the case of reading data from, for example, the memory cell 206 of the m-th column and the n-th row among the plurality of memory cells 206 included in the memory cell array 202, the decoder 203 and the selector 204 select the bit line Bm of the m-th column and the word line Wn of the n-th row. Thus, a voltage is applied to the gate electrode of the transistor 207 included in the memory cell 206 of the m-th column and the n-th row.

At this time, the memory element 208 included in the memory cell 206 and the resistor 211 are connected in series to each other, and the memory element 208 can be considered to be a resistor. When a predetermined voltage is applied to both ends of the two resistors connected in series, namely Vread and the common electrode 401 in FIG. 2B, the potential of a node a becomes a potential obtained by resistance dividing by the memory element 208 and the resistor 211. It is assumed herein that no voltage is applied to Vwrite when a voltage is applied to Vread, and a circuit (not shown) is provided to prevent current from flowing in the opposite direction.

The resistance of the memory element in the organic memory is changed when data is written by light irradiation, heating, or an electrical effect. Accordingly, the resistance of the memory element to which data is written is different from that of the memory element to which data is not written. Thus, the potential of the node α is different depending on whether data is written to the memory element or not.

Then, the potential of the node α is supplied to the sense amplifier 212. The sense amplifier 212 compares a reference potential (Vref) with the potential of the node a, thereby determining data of the memory element 208. After that, a signal including data determined by the sense amplifier 212 is supplied to the outside of the organic memory.

In the aforementioned description, data is read by a voltage value utilizing the difference in the resistance value of the memory element 208 and the resistance division; however, this mechanism is just an example and data of the memory element 208 may be read by other mechanisms. The other mechanisms include a method of reading data by comparing a current value, a method of reading data by precharging the bit line Bm and comparing changes in the potential of the bit line Bm, and the like; however, the invention is not limited to these.

As set forth above, in the semiconductor device of the invention having the organic memory, data can be written after the production by light irradiation, heating, or an electrical effect. Thus, the invention can provide an easy-to-use semiconductor device.

This embodiment mode can be implemented in combination with any of embodiment modes described in this specification.

Embodiment Mode 2

In this embodiment mode, manufacturing steps of a transistor and the memory element 208 that constitute the memory cell 206 are described with reference to FIGS. 9A to 9C, 10A 10B, 11A 11B, 12A and 12B, FIG. 3 in this order.

As the semiconductor device of the invention, a semiconductor device formed over a glass substrate may be used as it is, or a semiconductor device formed over a substrate may be separated from the substrate and attached to another flexible substrate in order to create functional added value. Described in this embodiment mode is the case of manufacturing a flexible semiconductor device by a separation process. Note that in this specification, steps of separating from a substrate and attaching to another substrate are referred to as a separation process.

First, a separation layer 503 is formed over a surface of a substrate 502 (FIG. 9A). The substrate 502 may be a glass substrate, a quartz substrate, a metal substrate or a stainless substrate having a surface over which an insulating layer is formed, a plastic substrate that is resistant to a treatment temperature in this step, or the like. The separation layer 503 is formed over the entire surface of the substrate 502 in this step; however, if necessary, the separation layer 503 formed over the entire surface of the substrate 502 may be patterned by using photolithography so as to be selectively formed. In addition, although the separation layer 503 is formed in contact with the substrate 502, if necessary, a base insulating layer may be formed in contact with the substrate 502 and the separation layer 503 may be formed in contact with the insulating layer. When the separation layer 503 is formed selectively, semiconductor elements and the like can be prevented from separating easily after the separation process.

The separation layer 503 may be formed by sputtering, plasma CVD or the like using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), iridium (Ir), and silicon (Si), or an alloy material or a compound material that mainly contains any of these elements. Note that the separation layer 503 may have a single layer structure using the aforementioned materials, or a stacked layer structure using any one of the aforementioned materials. The layer containing silicon may have an amorphous structure, a microcrystalline structure, or a polycrystalline structure.

If the separation layer 503 has a single layer structure, for example, a tungsten layer, a molybdenum layer, or a layer containing a mixture of tungsten and molybdenum is formed. Instead, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds, for example, to an alloy of tungsten and molybdenum. The oxide of tungsten may also be referred tows tungsten oxide.

If the separation layer 503 has a stacked layer structure, a tungsten layer, a molybdenum layer, or a layer containing a mixture of tungsten and molybdenum is formed as the first layer, and a layer containing an oxide, a nitride, an oxynitride, or a nitride oxide of tungsten, molybdenum, or a mixture of tungsten and molybdenum is formed as the second layer.

If the separation layer 503 has a stacked layer structure of a layer containing tungsten and a layer containing an oxide of tungsten, a layer containing silicon oxide may be formed over the layer containing tungsten, so that the layer containing an oxide of tungsten is formed at the boundary between the tungsten layer and the silicon oxide layer. The same applies to the case of forming a layer containing a nitride, an oxynitride and a nitride oxide of tungsten. After a layer containing tungsten is formed, a silicon nitride layer, a silicon oxynitride layer and a silicon nitride oxide layer may be formed thereover. The oxide of tungsten is represented by $WO_x$, where x ranges from 2 to 3. There are cases where x is 2 ($WO_2$), 2.5 ($W_2O_5$), 2.75 ($W_4O_{11}$), 3 ($WO_3$), or the like. In forming the oxide of tungsten, the value of x is not particularly limited and it may be decided depending on the etching rate and the like. Note that it is a layer containing an oxide of tungsten ($WO_x$, $0<x<3$) formed by sputtering in an oxygen atmosphere that has the most desirable etching rate. Therefore, in order to reduce the manufacturing time, a layer containing an oxide of tungsten is preferably formed as the separation layer 503 by sputtering in an oxygen atmosphere.

If a semiconductor device is formed over a substrate such as a glass substrate, and used as it is without using a separation process, the separation layer 503 is not necessarily formed and the following step may be performed as the first step.

Subsequently, an insulating layer 504 is formed as a base film to cover the separation layer 503. The insulating layer 504 is formed of a single layer or stacked layers that are formed by sputtering, plasma CVD or the like using an oxide of silicon or a nitride of silicon. The oxide of silicon is a material containing silicon (Si) and oxygen (O), and corresponds to silicon oxide, silicon oxynitride, silicon nitride oxide and the like. The nitride of silicon is a material containing silicon and nitrogen (N), and corresponds to silicon nitride, silicon oxynitride, silicon nitride oxide and the like. If the base insulating layer 504 has a two-layer structure, for example, a silicon nitride oxide layer and a silicon oxynitride layer may be formed as the first insulating layer and the second insulating layer, respectively. If the base insulating layer 504 has a three-layer structure, a silicon oxide layer, a silicon nitride oxide layer and a silicon oxynitride layer may be formed as the first insulating layer, the second insulating layer and the third insulating layer, respectively. Alternatively, a silicon oxynitride layer, a silicon nitride oxide layer and a silicon oxynitride layer may be formed as the first insulating layer, the second insulating layer and the third insulating layer, respectively. Since the base insulating layer 504 functions as a blocking film for preventing impurities from entering from the substrate 502, it preferably contains a nitride of silicon.

Next, an amorphous semiconductor layer 505 (e.g., a layer containing amorphous silicon) is formed over the insulating layer 504. The amorphous semiconductor layer 505 is formed by sputtering, LPCVD, plasma CVD or the like to have a thickness of 25 to 200 nm (preferably, 30 to 150 nm). Then, the amorphous semiconductor layer 505 is crystallized by a crystallization method (such as laser crystallization, thermal crystallization using RTA or an annealing furnace, thermal crystallization using a metal element that accelerates crystallization, and a method combining laser crystallization and thermal crystallization using a metal element that accelerates crystallization), thereby forming a crystalline semiconductor layer. After that, the obtained crystalline semiconductor layer is patterned into a desired shape to form crystalline semiconductor layers 706 to 710 (FIG. 9B).

An example of manufacturing steps of the crystalline semiconductor layers 706 to 710 is briefly described below. First, an amorphous semiconductor layer with a thickness of nm is formed by plasma CVD. After the amorphous semiconductor layer is coated with a solution containing nickel that is a metal element for accelerating crystallization, the amorphous semiconductor layer is subjected to dehydrogenation treatment (at 500° C. for one hour) and thermal crystallization treatment (at 550° C. for four hours), thereby forming a crystalline semiconductor layer. Then, the crystalline semiconductor layer is irradiated with laser light as needed, and patterned by using photolithography, so that the crystalline semiconductor layers 706 to 710 are formed. If the crystalline semiconductor layers 706 to 710 are formed by laser crystallization, a continuous wave solid-state or gas laser or a pulsed solid-state or gas laser can be employed. The gas laser includes an excimer laser, a YAG laser, a $YVO_4$ laser, a YLF laser, a $YAlO_3$ laser, a glass laser, a ruby laser, Ti: sapphire laser, and the like. The solid-state laser includes a laser using a crystal such as YAG, $YVO_4$, YLF, and $YAlO_3$ doped with Cr, Nd, Er, Ho, Ce, Co, Ti, or Tm.

Crystallization of the amorphous semiconductor layers using a metal element that accelerates crystallization has the advantages that crystallization can be achieved at a low temperature in a short time, and the crystals are arranged in the same direction. On the other hand, it has the disadvantages that since the metal element remains on the crystalline semiconductor layers, off-current increases and characteristics vary. Thus, an amorphous semiconductor layer functioning as a gettering site is preferably formed over the crystalline semiconductor layers. The amorphous semiconductor layer functioning as a gettering site is required to contain an impurity element such as phosphorus and argon; therefore, it is preferably formed by sputtering so as to contain argon at a high concentration. Then, a metal element is diffused in the amorphous semiconductor layer by heat treatment (such as RTA and thermal anneal using an annealing furnace), and the amorphous semiconductor layer containing the metal element is removed. As a result, the amount of the metal element in the crystalline semiconductor layers can be reduced or removed.

Subsequently, a gate insulating layer 705 is formed to cover the crystalline semiconductor layers 706 to 710. The gate insulating layer 705 is formed of a single layer or stacked layers that are formed by plasma CVD or sputtering using an oxide of silicon or a nitride of silicon. Specifically, a single layer or stacked layers are formed using a layer containing silicon oxide, a layer containing silicon oxynitride, or a layer containing silicon nitride oxide.

Subsequently, a bottom conductive layer and a top conductive layer are stacked over the gate insulating layer 705. The bottom conductive layer is formed by plasma CVD or sputtering to have a thickness of 20 to 100 nm. The top conductive layer is formed by plasma CVD or sputtering to have a thickness of 100 to 400 nm. The bottom conductive layer and the top conductive layer are formed of an element selected from tantalum (Ta), tungsten (W), titanium (Ti), molybdenum (Mo), aluminum (Al), copper (Cu), chromium (Cr), niobium (Nb), and the like, or an alloy material or a compound material that mainly contains any of these elements. Alternatively, the bottom conductive layer and the top conductive layer may be formed of a semiconductor material typified by polycrystalline silicon doped with an impurity element such as phosphorus. The bottom conductive layer and the top conductive layer are formed by combining, for example, tantalum nitride (TaN) and tungsten (W), tungsten nitride (WN) and tungsten, molybdenum nitride (MoN) and molybdenum (Mo), and the like. After the bottom conductive layer and the top conductive layer are formed of tungsten or tantalum nitride that has high heat resistance, they may be subjected to heat treatment for thermal activation. If a three-layer structure is adopted instead of the two-layer structure, a molybdenum layer, an aluminum layer and a molybdenum layer may be stacked.

Subsequently, a mask made of resist (a resist mask) is formed by photolithography, and the bottom conductive layer and the top conductive layer are etched to form gate electrodes and gate wires, thereby forming conductive layers 716 to 725 functioning as gate electrodes (also simply referred to as gate electrode layers). At this time, the difference in the etching rate between the bottom conductive layer and the second conductive layer allows the shape, in particular the taper angle of each conductive layer to be different.

The width of the gate electrode is preferably reduced to improve the performance of the thin film transistor. In this case, a resist mask or the like for patterning the gate electrode may be etched by oxygen plasma or the like, and then the gate electrode may be patterned.

Subsequently, a resist mask is formed by photolithography, and an impurity element that imparts N-type conductivity is added to the crystalline semiconductor layers 706 and 708 to 710 at a low concentration by ion doping or ion implantation, thereby forming N-type impurity regions 711 and 713 to 715 and channel forming regions 780 and 782 to 784. As the impurity element that imparts N-type conductivity, an element belonging to group 15 of the periodic table, for example such as phosphorus (P) and arsenic (As) is employed.

A resist mask is formed by photolithography, and an impurity element that imparts P-type conductivity is added to the crystalline semiconductor layer 707, thereby forming a P-type impurity region 712 and a channel forming region 781. As the impurity element that imparts P-type conductivity, for example boron (B) is employed.

An insulating layer is formed to cover the gate insulating layer 705 and the conductive layers 716 to 725. The insulating layer is formed of a single layer or stacked layers by plasma CVD or sputtering using an inorganic material such as silicon, an oxide of silicon, and a nitride of silicon, or an organic material such as an organic resin. Then, the insulating layer is selectively etched by anisotropic etching that is mainly performed in the perpendicular direction, so that insulating layers (also referred to as side walls) 739 to 743 are formed in contact with the lateral sides of the conductive layers 716 to 725 (FIG. 9C). At the same time as the insulating layers 739 to 743 formed, the gate insulating layer 705 is etched to form insulating layers 734 to 738. The insulating layers 739 to 743 may be used as masks for doping to form LDD (Lightly Doped Drain) regions later.

Next, an impurity element that imparts N-type conductivity is added to the crystalline semiconductor layers 706 and 708 to 710 using a resist mask formed by photolithography and the insulating layers 739 to 743 as masks, thereby forming first N-type impurity regions (also referred to as LDD regions) 727; 729, 731, and 733 and second N-type impurity regions (also referred to as source and drain regions) 726, 728, 730, and 732. The concentration of the impurity element contained in the first N-type impurity regions 727, 729, 731, and 733 is lower than that of the impurity element contained in the second N-type impurity regions 726, 728, 730, and 732. Through the aforementioned steps, N-type thin film transistors 744 and 746 to 748 and a P-type thin film transistor 745 are completed.

Note that the LDD region may be formed by either of the following two methods and so on: a gate electrode having a two or more layer structure is anisotropically etched and the semiconductor layer is doped with the lower conductive layer constituting the gate electrode being used as a mask; or a sidewall insulating layer being used as a mask. A thin film transistor that is formed by employing the former method has a structure where an LDD region overlaps a gate electrode with a gate insulating film interposed therebetween. Since this structure utilizes anisotropic etching of a gate electrode, the width of an LDD region cannot be controlled easily and an LDD region cannot be formed in some cases if an etching process is not performed well. Meanwhile, the latter method where a sidewall insulating layer is used as a mask has the advantages that an LDD region is surely formed and the width of an LDD region is controlled more easily as compared to the former method.

Figure 10A:
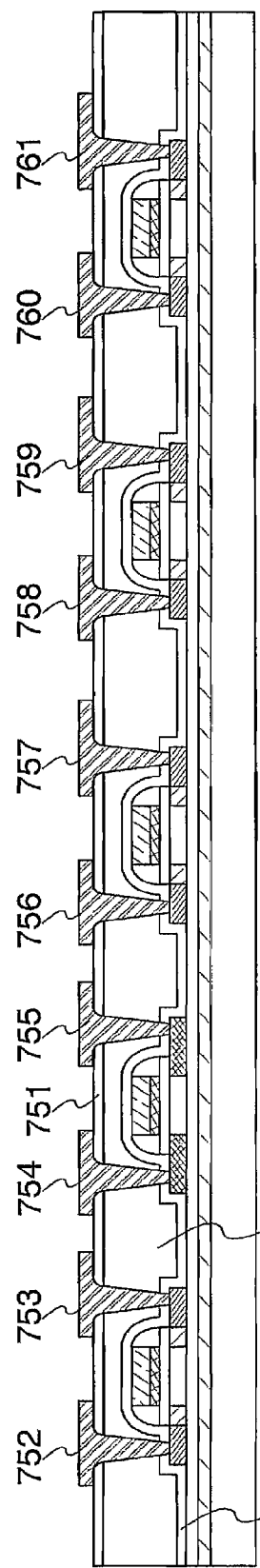
FIGS. 10A and 10B are diagrams showing manufacturing steps of the semiconductor device of the invention.

Subsequently, an insulating layer is formed of a single layer or stacked layers to cover the thin film transistors 744 to 748 (FIG. 10A). The insulating layer covering the thin film transistors 744 to 748 is formed of a single layer or staked layers by SOG or a droplet discharge method using an inorganic material such as an oxide of silicon and a nitride of silicon, an organic material such as polyimide, polyamide, benzocyclobutene, acrylic, epoxy, and siloxane, or the like. Siloxane is composed of a skeleton formed by the bond of silicon and oxygen, in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. For example, if the insulating layer covering the thin film transistors 744 to 748 has a three-layer structure, a layer containing silicon oxide may be used as a first insulating layer 749, a layer containing a resin is formed as a second insulating layer 750, and a layer containing silicon nitride may be formed as a third insulating layer 751.

Before forming the insulating layers 749 to 751, or after forming one or more of the insulating layers 749 to 751, heat treatment may be performed for recovery of the crystallinity of the semiconductor layers, activation of the impurity elements added to the semiconductor layers, and hydrogenation of the semiconductor layers. As the heat treatment, thermal anneal, laser anneal, RTA or the like may be adopted.

Subsequently, the insulating layers 749 to 751 are etched by using photolithography, thereby forming contact holes to expose the N-type impurity regions 726 and 728 to 732 and a P-type impurity region 712. Then, conductive layers are formed to fill in the contact holes, and are patterned to form conductive layers 752 to 761 functioning as source and drain wires.

The conductive layers 752 to 761 are formed of a single layer or stacked layers by plasma CVD or sputtering using an element selected from titanium (Ti), aluminum (Al) and neodymium (Nd), or an alloy material or a compound material mainly containing these elements. The alloy material mainly containing aluminum corresponds, for example, to a material that mainly contains, aluminum and contains nickel, or an alloy material that mainly contains aluminum and contains nickel and one or both of carbon and silicon. The conductive layers 752 to 761 may adopt a stacked layer structure of, for example, a barrier layer, an aluminum silicon (Al—Si) layer and a barrier layer, or a barrier layer, an aluminum silicon (Al—Si) layer, a titanium nitride (TiN) layer, and a barrier layer. The barrier layer corresponds to a thin film containing titanium, a nitride of titanium, molybdenum, or a nitride of molybdenum. Aluminum and aluminum silicon are suitable for the material of the conductive layers 752 to 761 since they have a low resistance value and are inexpensive. If barrier layers are provided as the top and bottom layers, hillock generation of aluminum or aluminum silicon can be prevented. In addition, if the barrier layer is formed of titanium that has high reducing ability, a thin natural oxide film which may possibly be formed over the crystalline semiconductor layer can be reduced and thus a favorable contact can be obtained between the barrier layer and the crystalline semiconductor layer.

Figure 10B:
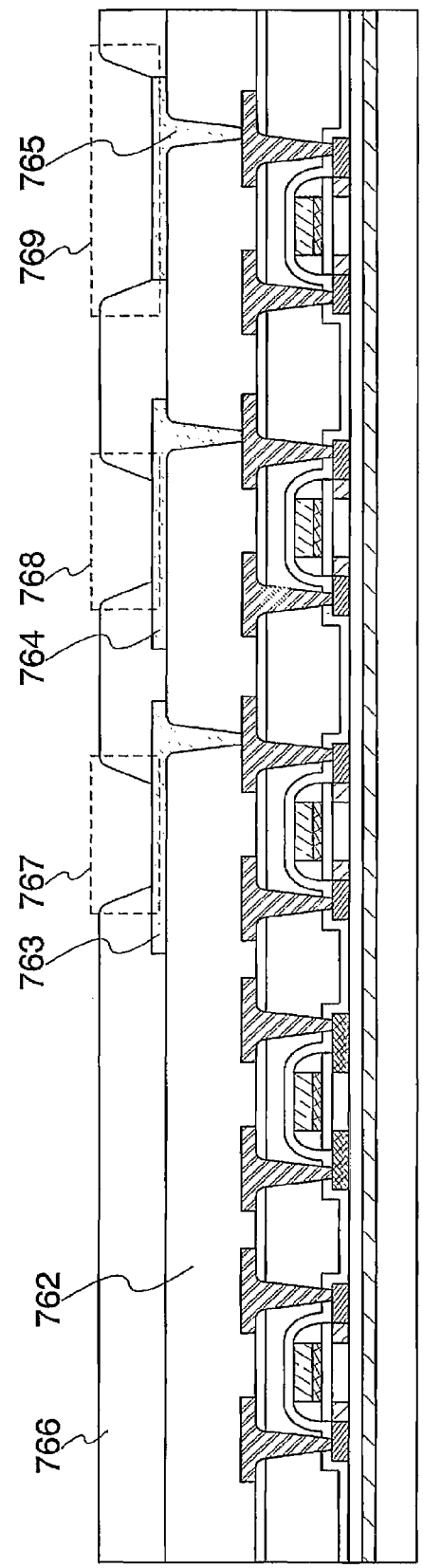

Then, an insulating layer 762 is formed to cover the conductive layers 752 to 761 (FIG. 10B). The insulating layer 762 is formed of a single layer or stacked layers by SOG or a droplet discharge method using an inorganic material or an organic material. The insulating layer 762 is preferably formed to have a thickness of 0.75 to 3 μm.

The insulating layer 762 is etched by using photolithography, thereby forming contact holes to expose the conductive layers 757, 759 and 761. Then, conductive layers are formed to fill in the contact holes. The conductive layer is formed by plasma CVD or sputtering using a conductive material. Subsequently, the conductive layer is patterned to form conductive layers 763 to 765. Note that the conductive layers 763 to 765 correspond to a first conductive layer 302 of a pair of conductive layers included in a memory element. Accordingly, it is preferable that the conductive layers 763 to 765 be formed of a single layer or stacked layers using titanium, or an alloy material or a compound material mainly containing titanium. Since titanium has a low resistance value, the size of the memory element can be reduced, leading to high integration. In addition, an etching step for forming the conductive layers 763 to 765 is preferably performed by wet etching so as not to damage the thin film transistors 744 to 748 on the bottom layer, and hydrogen fluoride (HF) or ammonia peroxide mixture may be used as an etching agent.

An insulating layer 766 is formed to cover the conductive layers 763 to 765. The insulating layer 766 is formed of a single layer or stacked layers by SOG or a droplet discharge method using an inorganic material or an organic material. The insulating layer 766 is preferably formed to have a thickness of 0.75 to 3 μm. Then, the insulating layer 766 is etched by using photolithography, thereby forming contact holes 767 to 769 to expose the conductive layers 763 to 765.

Figure 11A:
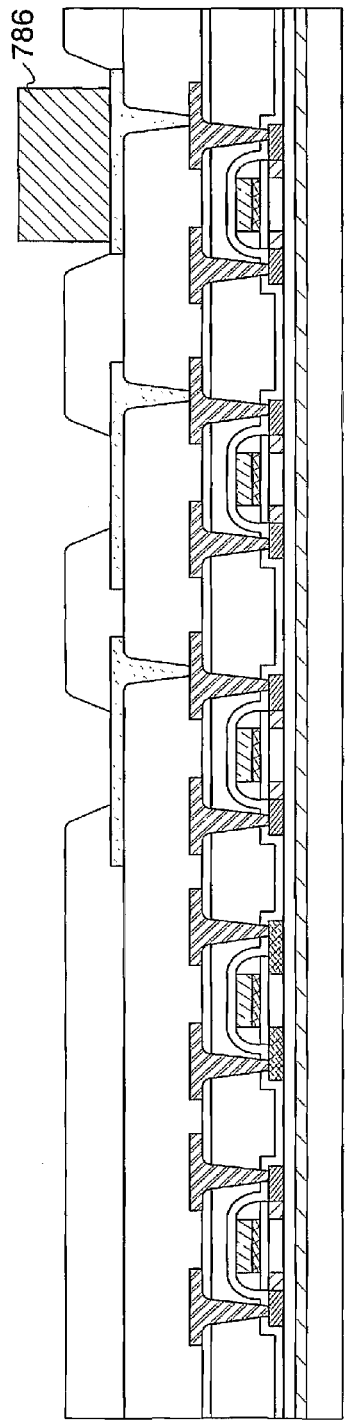
FIGS. 11A and 11B are diagrams showing manufacturing steps of the semiconductor device of the invention.

A conductive layer 786 functioning as an antenna is formed in contact with the conductive layer 765 (FIG. 11A). The conductive layer 786 is formed by plasma CVD, sputtering, printing, or a droplet discharge method using a conductive material. The conductive layer 786 is preferably formed of a single layer or stacked layers using an element selected from aluminum (Al), titanium (Ti), silver (Ag), and copper (Cu), or an alloy material or a compound material mainly containing these elements. Specifically, the conductive layer 786 is obtained by forming a paste containing silver by screen printing and then applying heat treatment at a temperature of 50 to 350° C. Alternatively, the conductive layer 786 may be obtained by forming an aluminum layer by sputtering and then patterning the aluminum layer. The aluminum layer is preferably patterned by wet etching, and then subjected to heat treatment at a temperature of 200 to 300° C.

If an antenna is formed over another substrate and attached later, a wire for connecting the antenna is formed instead of forming the antenna.

Figure 11B:
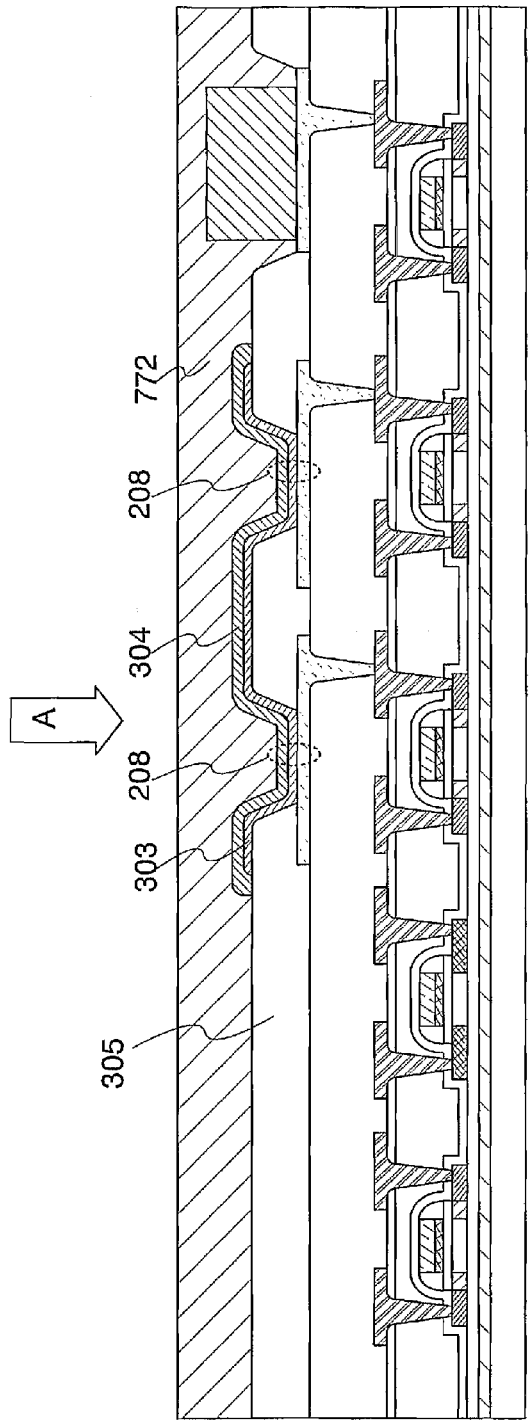

Subsequently, an organic compound layer 303 is formed in contact with the conductive layers 763 and 764 (FIG. 11B). The organic compound layer 303 is formed by a droplet discharge method, vapor deposition or the like. Then, a second conductive layer 304 is formed in contact with the organic compound layer 303. The second conductive layer 304 is formed by sputtering, vapor deposition or the like.

Each of the memory elements 208 corresponds to a stack of the first conductive layer 763 and 764, the organic compound layer 303 and the second conductive layer 304. An insulating layer 305 is provided between the adjacent memory elements 208. The organic compound layer 303 of the memory element 208 is formed of an organic compound material having a resistance that is changed by light irradiation, heating, or an electrical effect.

Among the organic compounds having a resistance that is changed by light irradiation, heating, or an electrical effect, an organic compound with high hole transporting properties includes, for example, an aromatic amine compound (having a bond of a benzene ring with nitrogen), phthalocyanine (abbreviated to $H_2Pc$), and a phthalocyanine compound such as copper phthalocyanine (abbreviated to CuPc) and vanadyl phthalocyanine (abbreviated to VOPc). The aromatic amine compound is, for example, 4,4'-bis[N-(1-naphthyl)-N-phenyl-amino]-biphenyl (abbreviated to □-NPD), 4,4'-bis[N-(3-methylphenyl)-N-phenyl-amino]-biphenyl (abbreviated to TPD), 4,4',4''-tris(N,N-diphenyl-amino)-triphenylamine (abbreviated to TDATA), 4,4',4'-tris[N-(3-methylphenyl)-N-phenyl-amino]-triphenylamine (abbreviated to MTDATA), or 4,4'-bis(N-(4-(N,N-di-m-tolylamino)phenyl)-N-phenylamino)biphenyl (abbreviated to DNTPD).

Among the organic compounds having a resistance that is changed by light irradiation, heating, or an electrical effect, an organic compound with high electron transporting properties includes, for example, a metal complex having a quinoline skeleton or a benzoquinoline skeleton, such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), and bis(2-methyl-8-quinolinolato)-4-phenylphenolato-aluminum (abbreviated to BAlq). Besides, a metal complex having an oxazole or thiazole ligand, such as bis[2-(2-hydroxyphenyl)benzoxazolate]zinc (abbreviated to $Zn(BOX)_2$) and bis[2-(2-hydroxyphenyl)benzothiazolate]zinc (abbreviated to $Zn(BTZ)_2$) may be used. In addition to the metal complex, other compounds may also be used, such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ) bathophenanthroline (abbreviated to BPhen), and bathocuproin (abbreviated to BCP).

Other organic compounds used for the organic compound layer 303 include, for example, 4-dicyanomethylene-2-methyl-6-(1,1,7,7-tetramethyljulolidyl-9-enyl)-4H-pyran (abbreviated to DCJT); 4-dicyanomethylene-2-t-butyl-6-(1,1,7,7-tetramethyljulolidyl-9-enyl)-4H-pyran; periflanthene; 2,5-dicyano-1,4-bis(10-methoxy-1,1,7,7-tetramethyljulolidyl-9-enyl)benzene; N,N'-dimethylquinacridone (abbreviated to DMQd); coumarin 6; coumarin 545T; tris(8-quinolinolato) aluminum (abbreviated to $Alq_3$); 9,9'-bianthryl; 9,10-diphenylanthracene (abbreviated to DPA); 9,10-bis(2-naphthyl)anthracene (abbreviated to DNA); and 2,5,8,11-tetra-t-butylperylene (abbreviated to TBP). The material to be a base material in the case of forming a layer where the aforementioned light emitting material is diffused includes an anthracene derivative such as 9,10-di(2-naphtyl)-2-tert-butylanthracene (abbreviated to t-BuDNA), a carbazole derivative such as 4,4'-bis(N-carbazolyl)biphenyl (abbreviated to CBP), and a metal complex such as bis[2-(2-hydroxyphenyl)pyridinato]zinc (abbreviated to $Znpp_2$) and bis[2-(2-hydroxyphenyl)benzoxazolate]zinc (abbreviated to ZnBOX). Besides, tris(8-quinolinolato)aluminum (abbreviated to $Alq_3$), 9,10-bis(2-naphtyl)anthracene (abbreviated to DNA), bis(2-methyl-8-quinolinolato)-4-phenylphenolato-aluminum (abbreviated to BAlq) or the like may be used as well.

Further, for example, a conjugated polymer doped with a compound (photoacid generator) that produces an acid by light absorption may also be used as the material of the organic compound layer 303. As the conjugated polymer, polyacetylene, polyphenylene vinylene, polythiophene, polyaniline, polyphenylene ethynylene, or the like may be used. As the photoacid generator, arylsulfonium salts, aryliodonium salts, o-nitrobenzyl tosylate, aryl sulfonic acid p-nitrobenzyl ester, sulfonyl acetophenone, Fe-allene complex PF6 salts or the like may be used.

The organic compound layer 303 may also be formed of a layer mixed with a metal oxide, a metal nitride or the like, or stacked layers thereof. More preferably, an oxide of a transition metal belonging to any one of groups 4 to 12 of the periodic table may be used. For example, it is preferable to use vanadium oxide, molybdenum oxide, rhenium oxide, tungsten oxide, ruthenium oxide, titanium oxide, chromium oxide, zirconium oxide, hafnium oxide, or tantalum oxide.

When using a layer containing a mixture of an organic compound and a metal oxide, or stacked layers thereof, crystallization of the organic compound layer can be suppressed and the organic compound layer can be formed thick without increasing the resistance. Accordingly, even when the surface of the substrate is uneven due to dust, dirt and the like, there is no important effect of the unevenness since the organic compound layer is increased in thickness. As a result, defects such as a short circuit due to the unevenness can be prevented. In addition, the increased thickness of the memory element allows the organic memory to be mounted on a flexible substrate while keeping the resistance to physical stress such as bending.

The organic compounds described above are just examples, and the invention is not limited to these. The organic compound layer 303 may have a single layer structure of the aforementioned organic compounds, or a stacked layer structure of any of them.

The second conductive layer 304 is described below. The second conductive layer 304 is formed in a linear shape as shown in FIG. 4. The second conductive layer 304 is formed on the same surface as the antenna or a surface parallel to the surface having antenna. Therefore, if the second conductive layer 304 is formed over a large surface, eddy currents are generated by electromagnetic waves emitted from a reader/writer, and the electromagnetic waves are absorbed, thereby blocking wireless communication. Meanwhile, if the second conductive layer 304 is formed in a linear shape, the generation of eddy currents can be prevented and the absorption of electromagnetic waves can be reduced. Thus, wireless communication of the semiconductor device is not blocked and the communication distance can be increased.

If data is written to the memory element by an optical effect, one or both of the first conductive layer 763 and 764 and the second conductive layer 304 transmit light. For example, if light is emitted as shown by an arrow A of FIG. 11B, at least the second conductive layer 304 is required to transmit light. In order to obtain a conductive layer that transmits light, a light transmissive conductive material is used, or a non-light transmissive conductive material is formed thin enough to transmit light. The light transmissive conductive material includes, for example, indium tin oxide (ITO), zinc oxide (ZnO), indium zinc oxide (IZO), zinc oxide doped with gallium (GZO), and other oxide conductive materials that transmit light; however, the invention is not limited to these. Alternatively, zinc oxide containing silicon oxide, indium tin oxide containing silicon oxide (IPSO), or a material obtained by using a target where ITSO is mixed with zinc oxide (ZnO) of 2 to 20 w % may be used. The non-light transmissive conductive material includes a single layer film containing one or more of TIN, ZrN, Ti, W, Ni, Pt, Cr, Ag, and Al, a two-layer film of a titanium nitride film and a film mainly containing aluminum, a three-layer film of a titanium nitride film, a film mainly containing aluminum, and a titanium nitride film, and the like.

Since the organic compound generally has low heat resistance, the organic compound layer 303 is formed after the formation of the conductive layer 786 functioning as an antenna as described above. However, if the semiconductor device of the invention is formed using a high heat resistant organic compound, the conductive layer 786 functioning as an antenna may be formed after the formation of the organic compound layer 303.

Subsequently, an insulating layer 772 functioning as a protective layer is formed by SOG or a droplet discharge method so as to cover the memory element 208 and the conductive layer 786 functioning as an antenna. The insulating layer 772 is formed of carbon such as DLC (Diamond Like Carbon), silicon nitride, silicon nitride oxide, or an organic material, and preferably formed of an epoxy resin.

Figure 12A:
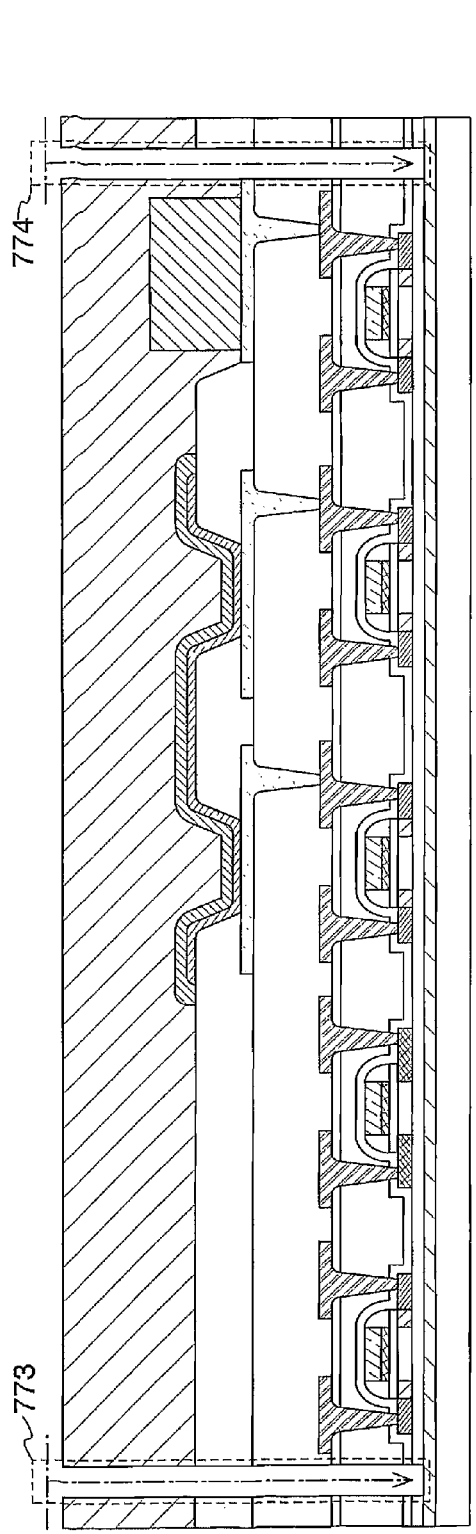
FIGS. 12A and 12B are diagrams showing manufacturing steps of the semiconductor device of the invention.

The insulating layers are etched by using photolithography to expose the separation layer 503, thereby forming openings 773 and 774 (FIG. 12A).

Figure 12B:
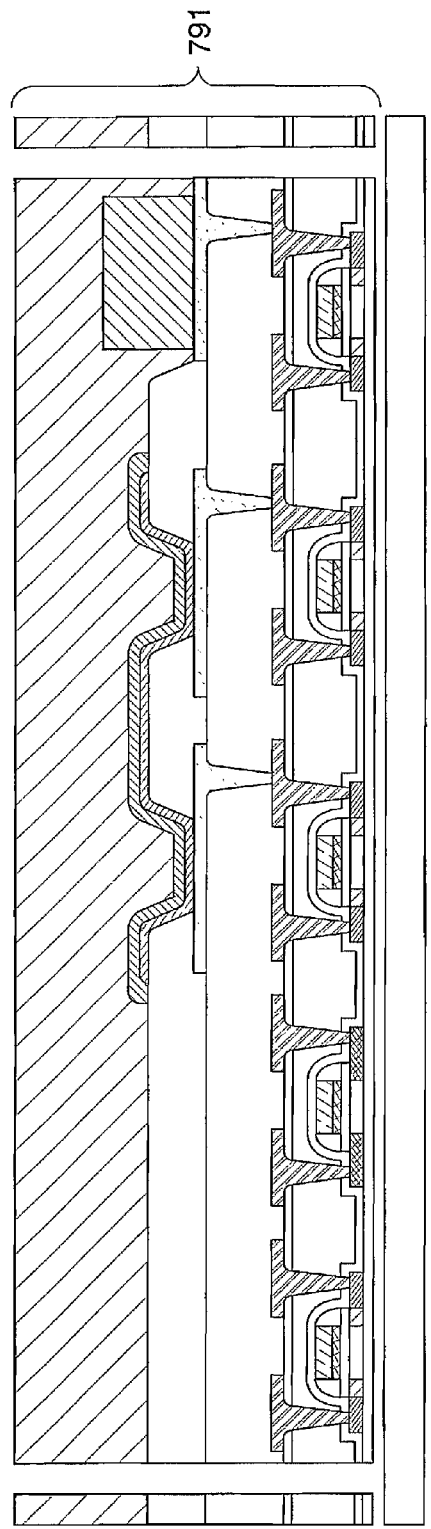

An etching agent is introduced into the openings 773 and 774 to remove the separation layer 503 (FIG. 12B). As the etching agent, a gas or a solution containing halogen fluoride or an interhalogen compound is used. For example, chlorine trifluoride ($ClF_3$) is used as a gas containing halogen fluoride. Thus, a thin film integrated circuit 791 is separated from the substrate 502. Note that the thin film integrated circuit 791 is constituted by the thin film transistors 744 to 748, the memory elements 208, and the conductive layer 786 functioning as an antenna. The separation layer 503 is not required to be entirely removed, and may remain partially. According to this, the processing time can be reduced, and the thin film integrated circuit 791 can be prevented from separating easily.

The substrate 502 separated from the thin film integrated circuit 791 may be reused for cost reduction. The insulating layer 772 prevents the thin film integrated circuit 791 from separating after the separation layer 503 is removed. That is, since the thin film integrated circuit 791 is small and lightweight, it is easily separated as it is not tightly attached to the substrate 502 after the separation layer 503 is removed. However, by forming the insulating layer 772 over the thin film integrated circuit 791, the weight of the thin film integrated circuit 791 can be increased and thus the separation thereof from the substrate 502 can be prevented. The thin film integrated circuit 791 itself is thin and lightweight; however, by forming the insulating layer 772, the thin film integrated circuit 791 is not rolled, and can have a certain degree of strength.

Next, one surface of the thin film integrated circuit 791 is attached to a first base 776 and completely separated from the substrate 502 (FIG. 3). Then, the other surface of the thin film integrated circuit 791 is attached to a second base 775, and the thin film integrated circuit 791 is sealed with the first base 776 and the second base 775 by one or both of heat treatment and pressure treatment. The first base 776 and the second base 775 may be a film made of polypropylene, polyester, vinyl, polyvinyl fluoride, polyvinyl chloride or the like, paper of a fibrous material, or a stacked film of a base film (polyester, polyamide, an inorganic vapor deposition film, paper, or the like) and an adhesive synthetic resin film (an acrylic synthetic resin, an epoxy synthetic resin, or the like). The film may be obtained by performing heat treatment and pressure treatment to the subject by thermocompression bonding. In performing the heat treatment and the pressure treatment, an adhesive layer provided on the outermost surface of the film, or a layer (not an adhesive layer) that is provided on the outermost layer and melted by heat treatment is attached by applying pressure. Adhesive layers may be provided over the surface of the first base 776 and the surface of the second base 775, or may not. The adhesive layers correspond to a layer having an adhesive agent containing a heat curing resin, an ultraviolet curing resin, or an epoxy resin, or an adhesive agent such as a resin additive.

Through the aforementioned steps, the semiconductor device having flexibility can be completed.

When the semiconductor device formed over the substrate 502 is used as it is, the aforementioned separation process, namely the step of forming the openings 773 and 774 and later steps are not required.

When a wire is formed to connect an antenna that is formed over another substrate, the wire is required to be exposed on the outermost surface.

In this embodiment mode, the transistor 2 is a thin film transistor using a thin film material for an active layer, however, the invention is not limited to this. The gate electrode of the thin film transistor may be formed over the semiconductor film or below of the semiconductor film.

As set forth above, the organic memory has a simple structure where an organic compound layer is provided between a pair of conductive layers. In addition, the semiconductor device of the invention can be formed using an inexpensive material such as a glass substrate and a flexible substrate. Thus, the semiconductor device of the invention can be manufactured through simple steps at a low cost.

Further, the semiconductor device of the invention can be provided at a lower cost by adopting a so-called multiple pattern technology where a plurality of semiconductor devices are formed over a large substrate and divided thereafter to be completed. In this case, a glass substrate, a flexible substrate or the like may be used as the large substrate. Such a glass substrate, a flexible substrate and the like have no limit on size and shape as compared with a circular silicon substrate. Accordingly, the productivity of the semiconductor device can be increased and mass production thereof can be achieved. As a result, the semiconductor device can be expected to be reduced in cost and provided at an extremely low unit price.

This embodiment mode can be implemented in combination with the aforementioned embodiment mode.

Embodiment Mode 3

Description is made on an example where a common electrode of an organic memory included in the semiconductor device of the invention is formed in a linear shape and an example of manufacturing steps thereof. The linear shape herein means a rectangle with a second side much longer than a first side, an ellipse with a long axis, or a long shape similar to these. The common electrode is electrically connected for applying the same potential to one terminal of all memory elements. Therefore, as shown in FIGS. 5A to 5D for example, the aforementioned rectangles or ellipses are preferably formed in a comb-like pattern, which are included in the linear shape. However, the linear shape is not limited to the examples shown herein, and any of shapes that can reduce the absorption of electromagnetic waves caused by eddy currents may be adopted. Further, the common electrode 401 is only required to have a shape that can reduce the absorption of electromagnetic waves caused by eddy currents, and is not required to be formed with high accuracy.

FIGS. 5A to 5D show substrates that are seen from the direction of the arrow A of FIG. 3. FIG. 5A shows a common electrode that is formed in a comb-like pattern. FIG. 5B shows a common electrode that is formed in a plurality of linear shapes and electrically connected through contact holes. FIG. 5C shows a common electrode having a shape obtained by joining elongated rectangles to have concave and convex shapes. The long side of the rectangles is provided in parallel to the decoder 203. FIG. 5D shows a common electrode that is formed in a ladder-like pattern. As described above, the common electrode 401 having a linear shape may be formed in various shapes.

The common electrode may be formed through various steps.

For example, the common electrode 401 may be formed in a linear shape when deposited over the substrate 306. A metal plate having a hole formed in a shape of a common electrode is put close to the substrate 306 from the direction of the arrow A of FIG. 3, and a conductor is deposited to form the common electrode with a desired shape. In this specification; the metal plate is referred to as a metal mask.

When the common electrode is formed in a linear shape using a metal mask, it is formed with lower accuracy than that formed by photolithography or the like. However, this accuracy is high enough to obtain a common electrode of a wireless tag that does not block wireless communication. For example, a common electrode formed using a metal mask has a line width of 10 μm or less, and preferably 2 to 4 μm.

When using a metal mask, the number of manufacturing steps of a common electrode can be reduced and the common electrode can be manufactured more easily than that using photolithography. In addition, the use of a metal mask has the advantage that the characteristics of other layers that have been formed over the substrate are not adversely affected. It is needless to say that the common electrode may be formed in a linear shape by using photolithography.

As shown in FIG. 5B, contact holes 501 may be provided between layers by which the common electrode are formed and a lower conductive layer, and the common electrodes may be electrically connected to the lower conductive layer. The extending direction of the line when the common electrode is formed in a linear shape is not limited to the examples shown in FIGS. 5A to 5D.

Alternatively, a common electrode may be formed by a droplet discharge method. The droplet discharge method is a generic term to refer to a method of forming a pattern by discharging a droplet, and includes ink jet printing and a dispenser method.

When adopting the droplet discharge method, a common electrode can be formed in a linear shape as shown in FIG. 5C. The common electrode is formed with lower accuracy when adopting the droplet discharge method; however, this accuracy is high enough to obtain a common electrode of a wireless tag that does not block wireless communication. In addition, the droplet discharge method can be easily performed. For example, a common electrode formed by the droplet discharge method has a line width of 40 μm or less, and preferably 10 to 20 μm.

The droplet discharge method has the advantages that a common electrode can be manufactured with a small number of steps and the wastage of material can be reduced.

The aforementioned manufacturing steps of the common electrode are lust examples, and the invention is not limited to these.

This embodiment mode can be implemented in combination with any of the aforementioned embodiment modes.

Embodiment 1

In this embodiment, manufacturing steps of an antenna constituting the semiconductor device of the invention are described.

The semiconductor device of the invention can read and write data wirelessly. Data is generally transmitted/received by any of the following three systems: an electromagnetic coupling system where a pair of coils are disposed to face each other and data is communicated by mutual induction; an electromagnetic induction system where data is communicated by the induction field; or a radio wave system where data is communicated through radio waves. The invention may adopt any of the three systems.

An antenna used for transmitting/receiving data may be mounted in various ways. For example, the antenna 102 may be mounted over the same substrate as a plurality of elements that constitute the power supply circuit 103, the clock generation circuit 104, the demodulation/modulation circuit 105, the control circuit 106, the interface (IF) circuit 107, and the memory 108. In this specification, the plurality of elements are referred to as an element group.

Figure 6A:
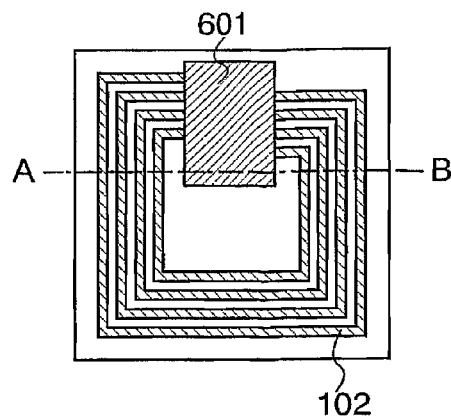
FIGS. 6A to 6D are diagrams showing semiconductor devices of the invention.
Figure 6B:
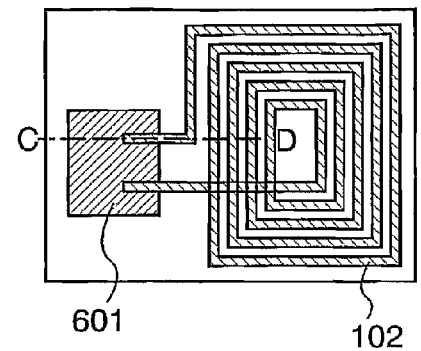
Figure 6C:
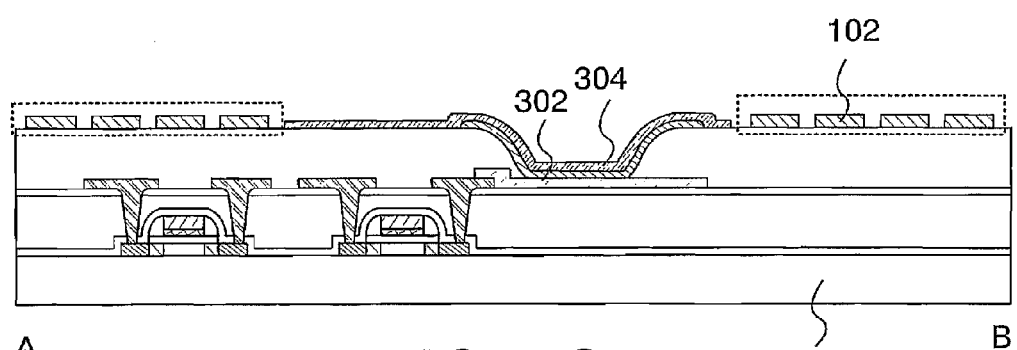

If the antenna 102 is formed over the same substrate as an element group 601 as shown in FIG. 6A and a cross sectional view thereof, FIG. 6C, a conductive layer functioning as the antenna 102 may be formed over the same layer as the second conductive layer 304 of the memory element.

However, the invention is not limited to the aforementioned structure, and the antenna 102 may be formed on the same layer as the first conductive layer 302 of the memory element. Instead, the antenna 102 may be formed on an insulating film that is formed to cover the element group 601.

Figure 6D:
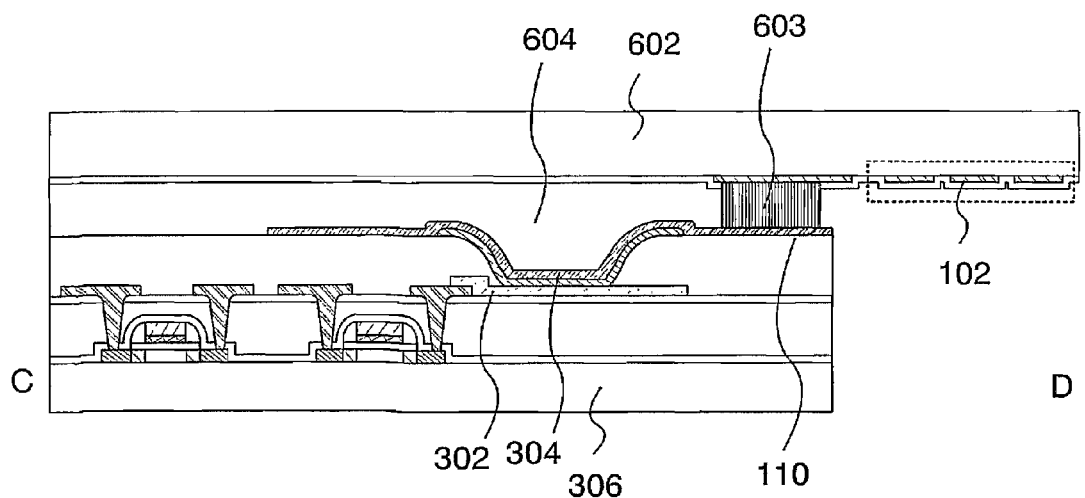

An antenna may be formed in another way as shown in FIG. 6B and a cross sectional view thereof, FIG. 6D, where the wire 110 for connecting the antenna is provided in the semiconductor device and the antenna 102 formed separately from the element group 601 is electrically connected to the wire 110.

If the antenna 102 is formed over another substrate 602 and electrically connected, the wire 110 for connecting the antenna 102 is provided over the substrate 306. For example, the wire 110 for electrically connecting the antenna is provided over the same layer as the second conductive layer 304, and the wire 110 for connecting the antenna is attached to the antenna 102. The attachment is performed using an anisotropic conductive film 603 or the like; however the invention is not limited to this.

A resin 604 may be used to attach the substrate 306 including the element group 601 and the substrate 602 including the antenna 102, and to fill in the space therebetween.

Alternatively, the antenna 102 may be formed over the substrate 602 by the droplet discharge method using a conductive paste containing nanoparticles of gold, silver, copper or the like. The droplet discharge method is a generic term to refer to a method of forming a pattern by discharging a droplet, and includes ink jet printing and a dispenser method, which has the advantage that use efficiency of the materials can be improved.

As another method, the antenna 102 may be formed by screen printing, plating, or patterning a conductive layer deposited on the substrate by using photolithography. The manufacturing method of the antenna 102 is appropriately selected in accordance with the shape thereof, depending on the data communication system or the application of the semiconductor device. The aforementioned manufacturing methods of the antenna are just examples, and the invention is not limited to these.

The antenna is formed on a plane surface and wireless communication with a reader/writer is influenced by a metal surface or the surface of a highly conductive substance provided in parallel to the surface having antenna. This is because the highly conductive substance absorbs electromagnetic waves emitted from the reader/writer. Therefore, the element group 601 and the antenna 102 are preferably formed over an insulating substrate such as a glass substrate and a flexible substrate rather than a metal substrate or a semiconductor substrate.

In addition, the second conductive layer 304, namely the common electrode is formed in a linear shape, so that the absorption of electromagnetic waves emitted from a reader/writer can be suppressed and a long communication distance can be achieved. Thus, the invention can provide the semiconductor device having a long communication distance.

This embodiment can be implemented in combination with any of the aforementioned embodiment modes.

Embodiment 2

Described in this embodiment is an example of manufacturing steps of a semiconductor element that constitutes the semiconductor device of the invention.

The element group 601 of the semiconductor device 101 of the invention is constituted by a number of semiconductor elements such as transistors and capacitors.

Any of an amorphous semiconductor, a microcrystalline semiconductor, a polycrystalline semiconductor, and an organic semiconductor may be adopted as an active layer of a semiconductor element in a circuit. In order to obtain a semiconductor element with improved properties, an active layer is preferably crystallized using a metal element as a catalyst, or by laser irradiation. Instead, a semiconductor layer may be formed as an active layer by plasma CVD using $SiH_4$ gas and $F_2$ gas, or $SiH_4$ gas and $H_2$ gas (Ar gas), or the thus obtained semiconductor layer may be irradiated with laser light.

The semiconductor element in the circuit may also use a crystalline semiconductor layer (low temperature polysilicon layer) that is crystallized at a temperature of 200 to 600° C. (preferably, 350 to 500° C.), or a crystalline semiconductor layer (high temperature polysilicon layer) that is crystallized at a temperature of 600° C. or more as an active layer. When a high temperature polysilicon layer would be formed over the substrate, a quartz substrate is preferably used since a glass substrate is not resistant to heat.

Hydrogen or halogen elements may be added to the active layer (particularly, channel forming region) of the semiconductor element in the circuit at a concentration of $1 \times 10^{19}$ to $1 \times 10^{22}$ atoms/cm$^3$, and preferably $1 \times 10^{19}$ to $5 \times 10^{20}$ atoms/cm$^3$. According to this, cracks hardly occur in the active layer and the active layer with few defects can be obtained.

Crystals constituting the active layer of the semiconductor element in the circuit are preferably formed so that the crystal grain boundary extends parallel to the flowing direction of carriers (the channel length direction). Such an active layer may be formed by irradiation with a continuous wave laser (abbreviated to CWLC) or a pulsed laser operating at a frequency of 10 MHz or more, and preferably 60 to 100 MHz.

The active layer of the semiconductor element in the circuit may have a thickness of 20 to 200 nm, preferably 40 to 170 nm, and more preferably 50 to 150 nm. According to this, cracks hardly occur in the active layer.

The transistor in the circuit preferably has an S value (sub-threshold value) of 0.35 V/dec or less (more preferably, 0.09 to 0.25 V/dec) and a mobility of 10 cm$^2$/Vs or more. Such characteristics are achieved when the active layer is formed by irradiation with a continuous wave laser or a pulsed laser operating at a frequency of 10 MHz or more.

Further, the transistor in the circuit preferably has a frequency of 1 MHz or more, and more preferably 10 MHz or more at the ring oscillator level with nine inverters (at a voltage of 3 to 5 V). Alternatively, the frequency thereof per gate is 100 kHz or more, and preferably 1 MHz or more.

Since the semiconductor device of the invention may be touched with human hands, a protective layer is preferably provided to, protect the semiconductor device from contamination with an alkali metal typified by sodium (Na) contained in hand sweat and the like. The protective layer is preferably provided to cover the semiconductor element in the circuit or the entire circuit. As a result, the semiconductor device that is protected from contamination and increased in reliability can be provided.

As a material of the protective layer, inorganic materials such as aluminum nitride, aluminum oxide, silicon nitride, silicon nitride oxide, and silicon oxynitride can be used. However, these materials are just examples, and the invention is not limited to these.

The element group constituting the circuit may be formed in a plurality of layers. If the element group is formed in a plurality of layers, interlayer insulating films are used. As a material of the interlayer insulating films, compound materials including a resin material such as an epoxy resin and an acrylic resin, a light transmissive resin material such as a polyimide resin, an inorganic material obtained by polymerizing such as a siloxane polymer, and a material containing water-soluble homopolymer and water-soluble copolymer can be used.

Siloxane is composed of a skeleton formed by the bond of silicon and oxygen, in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

If the circuit has a multilayer structure, a low dielectric constant material is preferably used as a material of the interlayer insulating films so as to reduce parasitic capacitance occurring between layers. The reduction in parasitic capacitance results in higher operation and lower power consumption.

The aforementioned materials of the interlayer insulating films are just examples, and the invention is not limited to these.

The wireless communication between the reader/writer and the semiconductor device constituted by the thus formed semiconductor elements is influenced by a metal surface by the surface of a highly conductive substance provided in parallel to a plane surface having an antenna. This is because the highly conductive substance absorbs electromagnetic waves emitted from the reader/writer. Therefore, the semiconductor element and the antenna are preferably formed over an insulating substrate such as a glass substrate and a flexible substrate rather than a metal substrate or a semiconductor substrate.

In addition, a common electrode of an organic memory incorporated in the semiconductor device of the invention is formed in a linear shape, so that the absorption of electromagnetic waves emitted from a reader/writer can be suppressed and a long communication distance can be achieved. Thus, the invention can provide the semiconductor device that includes the semiconductor elements having a long communication distance and high performance.

This embodiment can be implemented in combination with any of the aforementioned embodiment modes.

Embodiment 3

Described in this embodiment are manufacturing steps of a flexible semiconductor device by a separation process.

Figure 7A:
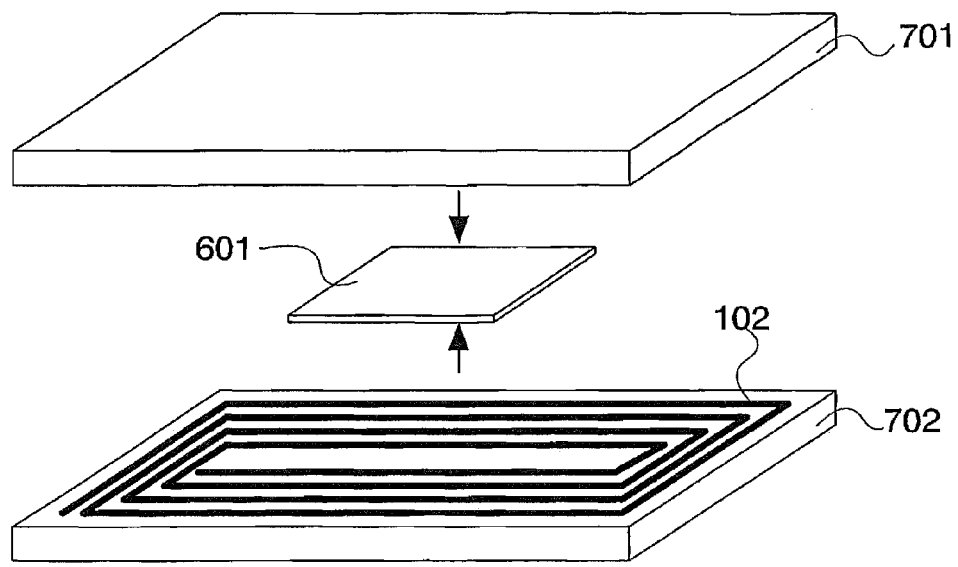
FIGS. 7A to 7C are diagrams showing semiconductor devices of the invention.

The separated element group 601 is attached to a protective layer 701 with flexibility, and attached to a protective layer 702 with flexibility over which the antenna 102 and the like are formed, thereby completing a semiconductor device (FIG. 7A). Note that an example of the protective layer with flexibility is a flexible substrate.

The semiconductor device shown in FIG. 7A has the protective layer 701 with flexibility, the protective layer 702 with flexibility including the antenna 102, and the element group 601 separated from the substrate by a separation process. The antenna 102 formed over the protective layer 702 is electrically connected to the element group 601. Although the antenna 102 is formed only over the protective layer 702 in the shown structure, the invention is not limited to this structure and the antenna 102 may also be formed over the protective layer 701 or over the same substrate as the element group 601.

When a film made of silicon nitride or the like is formed between the element group 601 and the protective layer 701 and between the element group 601 and the protective layer 702, the element group 601 can be protected from contamination with an alkali metal and the like. As a result, a wireless tag with increased reliability can be provided.

The antenna 102 is desirably silver, copper, or a metal plated with them. The element group 601 is connected to the antenna 102 by applying UV treatment or ultrasonic treatment to an anisotropic conductive film; however, the invention is not limited to this method and various methods may be adopted.

Figure 7B:
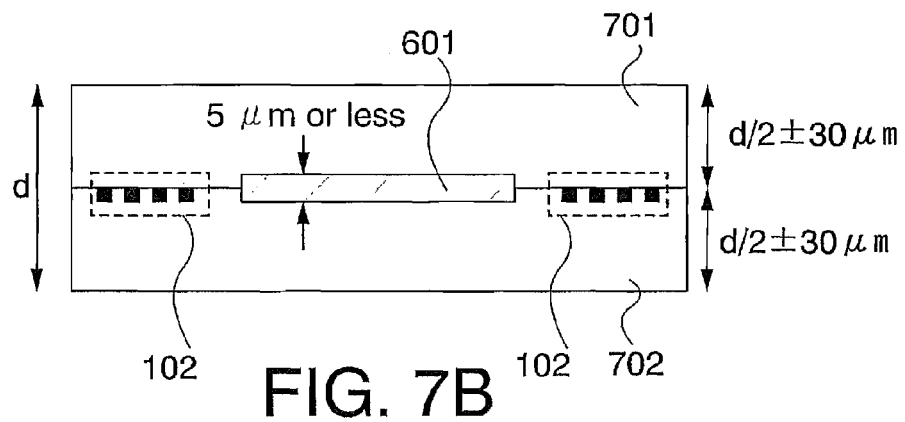

FIG. 7B is a cross sectional view of FIG. 7A. The element group 601 sandwiched between the protective layers 701 and 702 is preferably formed to have a thickness of 5 μm or less, and more preferably 0.1 to 3 μm. When it is assumed that the total thickness of the stacked protective layers 701 and 702 is d, each of the protective layers 701 and 702 preferably has a thickness of (d/2)±30 μm, and more preferably (d/2)±10 μm. The element group 601 has an area of 5 mm square (25 mm$^2$) or less, and preferably 0.3 to 4 mm square (0.09 to 16 mm$^2$).

The protective layers 701 and 702 that are formed of an organic resin material have high resistance to bending. The element group 601 that is formed over a glass substrate or the like and then separated from the substrate by a separation process has higher resistance to bending as compared with a semiconductor element formed over a single crystalline semiconductor substrate such as a silicon substrate. The element group 601 can be tightly attached to the protective layers 701 and 702 without having a space; therefore, the completed semiconductor device itself has high resistance to bending. Such an element group 601 sandwiched between the protective layers 701 and 702 may be disposed on the surface of or inside an object, or incorporated in paper.

Figure 7C:
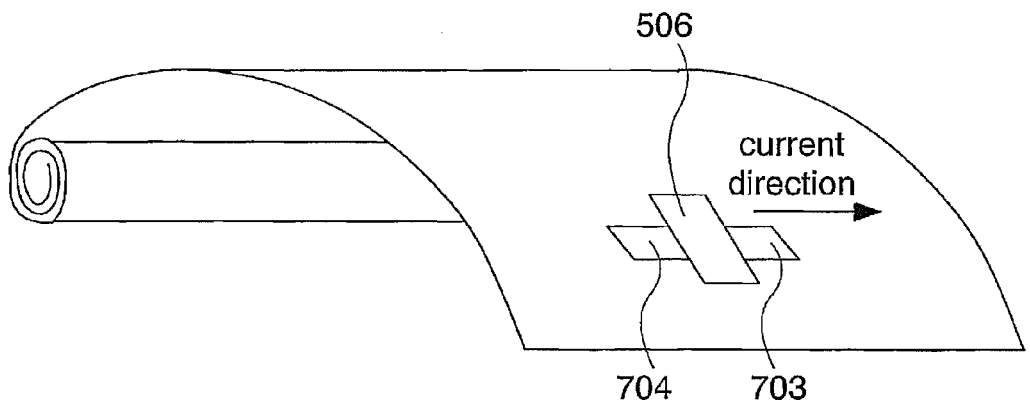

Description is made on the case where a semiconductor device with flexibility is attached to a substrate having a curved surface (FIG. 7C). FIG. 7C shows one transistor constituting the semiconductor device. A drain region 703, a gate electrode 506 and a source region 704 are arranged linearly, and current flows in this direction. The current direction is perpendicular to the arc drawn by the substrate. Such an arrangement allows the influence of the stress on the transistor to be reduced and variations in characteristics of the transistor to be suppressed, even when the substrate is bent and draws an arc.

In order to prevent a semiconductor element such as a transistor from being damaged due to stress, an active region (silicon island portion) of the semiconductor element desirably occupies not more than 50% (more preferably, 1 to 30%) of the area of the substrate. A region where the semiconductor element such as a transistor is not provided mainly includes a base insulating film material, an interlayer insulating film material and a wiring material. The area other than the active region of a transistor and the like desirably occupies not less than 60% of the area of the substrate. As a result, the semiconductor device that is easily bent and highly integrated can be provided.

As set forth above, when the element group 601 is attached to the protective layer and the like with flexibility, a thin, lightweight and strong semiconductor device can be provided. In addition, the semiconductor device 101 obtained by attaching the element group 601 to a flexible substrate can be attached to a surface other than a plane surface, such as a curved surface, and thus various applications can be achieved.

For example, a wireless tag that is one mode of the semiconductor device 101 of the invention can be tightly attached to a curved surface such as a bottle. In addition, since the substrate can be reused, an inexpensive semiconductor device can be provided.

The wireless communication between the thus formed semiconductor device of the invention and a reader/writer is influenced by a metal surface or a surface of a highly conductive substance provided in parallel to the surface having an antenna over a plane surface. This is because the highly conductive substance absorbs electromagnetic waves emitted from the reader/writer. Therefore, the element group 601 and the antenna 102 are preferably formed over an insulating substrate such as a glass substrate and a flexible substrate rather than a metal substrate or a semiconductor substrate.

In addition, the second conductive layer 304 of the memory element, namely, the common electrode is formed in a linear shape, so that the absorption of electromagnetic waves emitted from a reader/writer can be suppressed and a long communication distance can be achieved. Thus, the invention can provide a small, lightweight and inexpensive semiconductor device that has a long communication distance and flexibility as an added value.

This embodiment can be implemented in combination with any of the aforementioned embodiment modes.

Embodiment 4

In this embodiment, applications of the semiconductor device of the invention are specifically described.

The semiconductor device of the invention is widely used. For example, a wireless tag that is one mode of the semiconductor device of the invention may be mounted on various objects such as bills, coins, securities, certificates, bearer bonds, containers for packages, books, recording media, personal belongings, vehicles, foods, clothes, healthcare items, livingware, medicals, and electronic apparatuses.

The bills and coins include currency in the market and include a note that is in currency in a specific area as money (cash voucher), memorial coins, and the like. The securities include a check, a certificate, a promissory note, and the like. The certificates include a driving license, a resident card, and the like. The bearer bonds include a stamp, a rice coupon, various gift coupons, and the like. The containers for wrapping objects include paper for packing a box lunch or the like, a plastic bottle, and the like. The books include a document and the like. The recording media include DVD software, a video tape, and the like. The personal belongings include a bag, glasses, and the like. The vehicles include a wheeled vehicle such as a bicycle, a vessel, and the like. The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic apparatuses include a liquid crystal display device, an EL display device, a television set (television receiver, thin television receiver), a mobile phone, and the like.

When a wireless tag is mounted on bills, coins, securities, certificates, bearer bonds, and the like, forgery of them can be prevented. When a wireless tag is mounted on containers for wrapping objects, books, recording media, personal belongings, foods, livingware, electronic apparatuses, and the like, inspection systems, rental systems and the like can be performed more efficiently. When a wireless tag is mounted on vehicles, healthcare items, medicals, and the like, forgery and theft of them can be prevented and medicines can be prevented from being consumed in the wrong manner. A wireless tag may be attached to the surface of a product or incorporated in a product. For example, a wireless tag may be incorporated in the paper of a book, or an organic resin of a package.

Figure 8A:
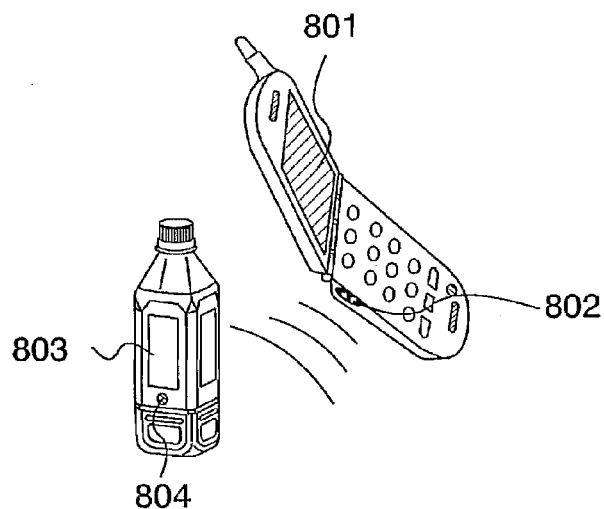
FIGS. 8A and 8B are diagrams showing applications of semiconductor devices of the invention.

When the semiconductor device is thus applied to product management and distribution system, high performance system can be achieved. For example, as shown in FIG. 8A, a reader/writer 802 may be provided on the side of a portable terminal including a display portion 801 while a semiconductor device 804 that is one mode of the semiconductor device of the invention may be provided on the side of a product 803. In this case, when the semiconductor device 804 is put close to the reader/writer 802, the display portion 801 displays data on the product 803 such as ingredients, a place of origin, and a record of the distribution process.

Figure 8B:
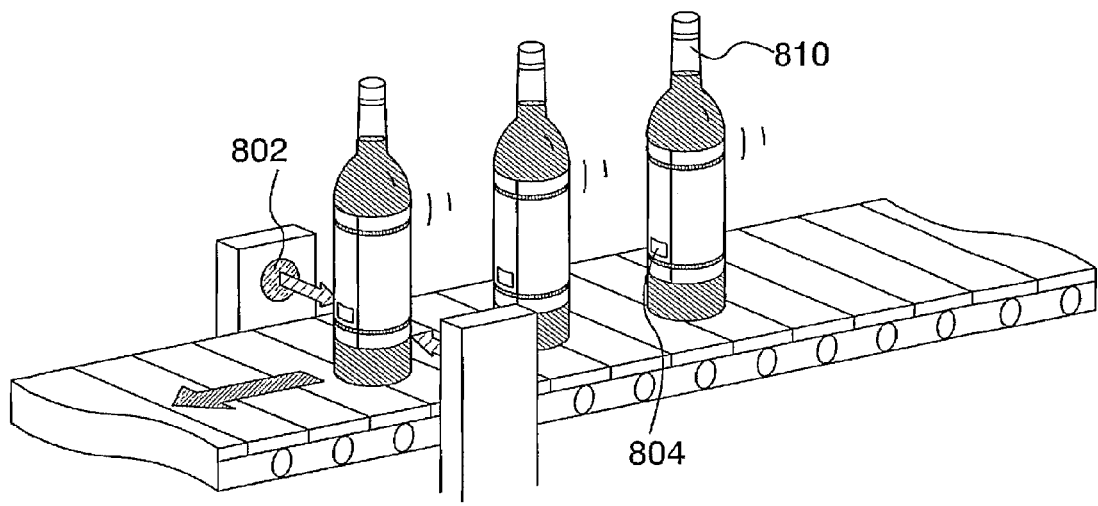

As another example, as shown in FIG. 8B, a product 810 including the semiconductor device 804 may be carried on a conveyor belt while the reader/writer 802 may be provided beside the conveyor belt. In such a case, the product 810 can be inspected easily.

In the case where the distance between the semiconductor device 804 and the reader/writer 802 is not fixed as shown in the inspection system of FIG. 8B, the wireless tag is required to have a long communication distance. The wireless tag of the invention which is not influenced by moisture communicates data by an electromagnetic induction system, thus the invention can provide the wireless tag that communicates data without being blocked and has a long communication distance.

This embodiment can be implemented in combination with any of the aforementioned embodiment modes.

Embodiment 5

In this embodiment, an operation of reading data from a memory element portion by an electrical effect is specifically described with reference to FIGS. 2A and 2B and FIG. 13.

Figure 13:
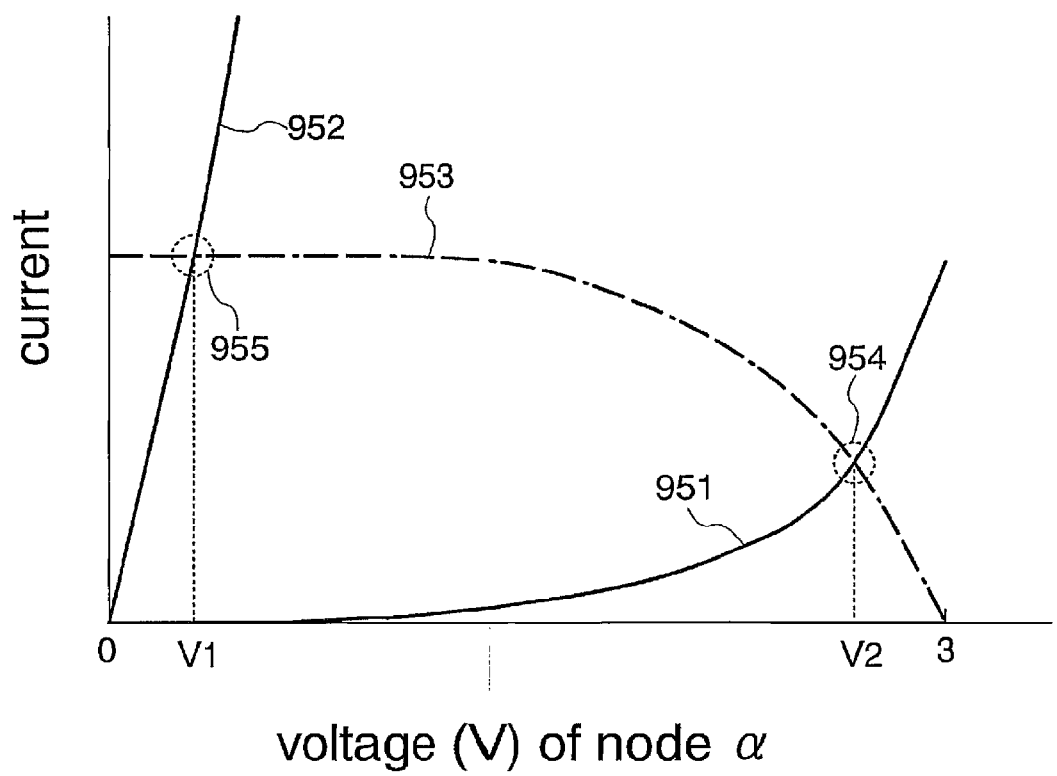
FIG. 13 is a diagram showing the operation of a semiconductor device of the invention.

FIG. 13 shows a current-voltage characteristic 951 of the memory element portion to which data "0" is written, a current-voltage characteristic 952 of a memory element portion to which data "1" is written, and a current-voltage characteristic 953 of the resistor 211. The abscissa axis indicates the voltage of node α. The resistor 211 herein is a transistor. It is assumed that a voltage of 3 V is applied between the common electrode 401 and Vread as an operating voltage for reading data.

An intersection 954 of the current-voltage characteristic 951 of the memory element portion and the current-voltage characteristic 953 of the transistor represents an operating point of a memory cell having the memory element portion to which data "0" is written. The potential of the node α is V2 (V) at this time. The potential of the node α is supplied to the sense amplifier 212 to be compared with a reference potential (Vref), so that the data stored in the memory cell is determined to be "0".

On the other hand, an intersection 955 of the current-voltage characteristic 952 of the memory element portion and the current-voltage characteristic 953 of the transistor represents an operating point of a memory cell having the memory element portion to which data "1" is written. The potential of the node α is V1 (V) at this time. Then, as shown in FIG. 2B, the potential of the node α is supplied to the sense amplifier 212 to be compared with a reference potential (Vref)), so that the data stored in the memory cell is determined to be "1".

The sense amplifier 212 has a function of comparing the supplied potential of the node a with Vref to determine whether is higher or lower. Thus, the potential of Vref is set to satisfy V1<Vref<V2.

In this manner, data stored in the memory cell can be easily determined by reading a resistance-divided potential in accordance with the resistance value of the memory element 208.

In the aforementioned method, data is read by a voltage value utilizing the difference in the resistance value of the memory element 208 and the resistance division; however, data of the memory element 208 may be read by a current value.

Thus, the semiconductor device has a simple structure, requires only a simple operation to read and write data, and incorporates an organic memory manufactured at a low cost. Such a semiconductor device can further meet users' demand when having a longer communication distance.

The wireless communication distance is influenced by a metal surface or a surface of a highly conductive substance provided in parallel to the plane surface having an antenna. This is because the highly conductive substance absorbs electromagnetic waves emitted from a reader/writer.

Therefore, a common electrode of an organic memory is formed in a linear shape. When a common electrode with high conductivity is formed in a linear shape, the absorption of electromagnetic waves emitted from a reader/writer can be suppressed and a long communication distance can be achieved. In this manner, the invention can provide an easy-to-use semiconductor device having a long communication distance.

What is claimed is:

1. A semiconductor device comprising:
   an organic memory provided with a memory cell array including a plurality of memory cells; and
   a control circuit for controlling the organic memory,
   wherein each of the plurality of memory cells includes a transistor and a memory element,
   wherein the memory element includes a first conductive layer, an organic compound layer, and a second conductive layer, and wherein the second conductive layer is common for memory elements each in one of the plurality of memory cells and formed in a linear shape.

2. The semiconductor device according to claim 1, wherein the organic compound layer is an electron transporting layer or a hole transporting layer.

3. The semiconductor device according to claim 1, wherein the organic compound layer comprises a material having a resistance that is changed by light irradiation, heating, or an electrical effect.

4. The semiconductor device according to claim 1, wherein the semiconductor device further comprises one or more of a DRAM (Dynamic Random Access Memory), an SRAM (Static Random Access Memory), an FeRAM (Ferroelectric Random Access Memory), a mask ROM (Mask Read Only Memory), a PROM (Programmable Read Only Memory), an EPROM (Electrically Programmable Read Only Memory), an EEPROM (Electrically Erasable Read Only Memory), and a flash memory in addition to the organic memory.

5. The semiconductor device according to claim 1, wherein the semiconductor device further comprises one or more of a power supply circuit, a clock generation circuit, a demodulation/modulation circuit, and an interface circuit in addition to the control circuit.

6. The semiconductor device according to claim 1, wherein the organic memory and the control circuit are provided over a flexible substrate.

7. The semiconductor device according to claim 1, wherein the control circuit includes a thin film transistor.

8. A semiconductor device comprising:
an organic memory provided with a memory cell array including a plurality of memory cells;
a control circuit for controlling the organic memory; and
an antenna,
wherein each of the plurality of memory cells includes a transistor and a memory element,
wherein the memory element includes a first conductive layer, an organic compound layer, and a second conductive layer, and
wherein the second conductive layer is common for memory elements each in one of the plurality of memory cells and formed in a linear shape.

9. The semiconductor device according to claim 8, wherein the organic compound layer is an electron transporting layer or a hole transporting layer.

10. The semiconductor device according to claim 8, wherein the organic compound layer comprises a material having a resistance that is changed by light irradiation, heating, or an electrical effect.

11. The semiconductor device according to claim 8, wherein the semiconductor device further comprises one or more of a DRAM (Dynamic Random Access Memory), an SRAM (Static Random Access Memory), an FeRAM (Ferroelectric Random Access Memory), a mask ROM (Mask Read Only Memory), a PROM (Programmable Read Only Memory), an EPROM (Electrically Programmable Read Only Memory), an EEPROM (Electrically Erasable Read Only Memory), and a flash memory in addition to the organic memory.

12. The semiconductor device according to claim 8, wherein the semiconductor device further comprises one or more of a power supply circuit, a clock generation circuit, a demodulation/modulation circuit, and an interface circuit in addition to the control circuit.

13. The semiconductor device according to claim 8, wherein the organic memory and the control circuit are provided over a flexible substrate.

14. The semiconductor device according to claim 8, wherein the organic memory, the control circuit, and the antenna are formed over a glass substrate.

15. The semiconductor device according to claim 8, wherein the organic memory, the control circuit, and the antenna are formed over a flexible substrate.

16. The semiconductor device according to claim 8, wherein the control circuit includes a thin film transistor.

17. A semiconductor device comprising:
an organic memory provided with a memory cell array including a plurality of memory cells; and
a control circuit for controlling the organic memory,
wherein each of the plurality of memory cells includes a transistor and a memory element,
wherein the memory element includes a first conductive layer, an organic compound layer, and a second conductive layer,
wherein the second conductive layer is common for memory elements each in one of the plurality of memory cells and formed in a linear shape, and
wherein one or both of the first conductive layer and the second conductive layer transmit light.

18. The semiconductor device according to claim 17, wherein the organic compound layer is an electron transporting layer or a hole transporting layer.

19. The semiconductor device according to claim 17, wherein the organic compound layer comprises a material having a resistance that is changed by light irradiation, heating, or an electrical effect.

20. The semiconductor device according to claim 17, wherein the semiconductor device further comprises one or more of a DRAM (Dynamic Random Access Memory), an SRAM (Static Random Access Memory), an FeRAM (Ferroelectric Random Access Memory), a mask ROM (Mask Read Only Memory), a PROM (Programmable Read Only Memory), an EPROM (Electrically Programmable Read Only Memory), an EEPROM (Electrically Erasable Read Only Memory), and a flash memory in addition to the organic memory.

21. The semiconductor device according to claim 17, wherein the semiconductor device further comprises one or more of a power supply circuit, a clock generation circuit, a demodulation/modulation circuit, and an interface circuit in addition to the control circuit.

22. The semiconductor device according to claim 17, wherein the organic memory and the control circuit are provided over a flexible substrate.

23. The semiconductor device according to claim 17, wherein the control circuit includes a thin film transistor.

24. A semiconductor device comprising:
a memory provided with a memory cell array including a plurality of memory cells; and
a circuit for controlling the memory,
wherein each of the plurality of memory cells includes a transistor and a memory element,
wherein the memory element includes a first conductive layer, an organic compound layer, and a second conductive layer, and
wherein the second conductive layer is common for memory elements each in one of the plurality of memory cells and formed in a linear shape.

25. The semiconductor device according to claim 24, wherein the memory is an organic memory.

26. The semiconductor device according to claim 24, wherein the organic compound layer is an electron transporting layer or a hole transporting layer.

27. The semiconductor device according to claim 24, wherein the organic compound layer comprises a material having a resistance that is changed by light irradiation, heating, or an electrical effect.

28. The semiconductor device according to claim 24, wherein the semiconductor device further comprises one or more of a DRAM (Dynamic Random Access Memory), an SRAM (Static Random Access Memory), an FeRAM (Ferroelectric Random Access Memory), a mask ROM (Mask Read Only Memory), a PROM (Programmable Read Only Memory), an EPROM (Electrically Programmable Read Only Memory), an EEPROM (Electrically Erasable Read Only Memory) and a flash memory.

29. The semiconductor device according to claim 24, wherein the semiconductor device further comprises one or more of a power supply circuit, a clock generation circuit, and a demodulation/modulation circuit.

* * * * *

UNITED STATES PATENT AND TRADEMARK OFFICE
CERTIFICATE OF CORRECTION

PATENT NO.         : 8,507,902 B2
APPLICATION NO.    : 13/096094
DATED              : August 13, 2013
INVENTOR(S)        : Kiyoshi Kato Page 1 of 1

It is certified that error appears in the above-identified patent and that said Letters Patent is hereby corrected as shown below:

In the Specification

At column 8, line 39, "node a" should be -- node α --;

At column 8, line 54, "node a," should be -- node α, --;

At column 9, line 65, "tows" should be -- to as --;

At column 11, line 5, "nm" should be -- 66 nm --;

At column 17, line 4, "(IPSO)" should be -- (ITSO) --;

At column 17, line 8, "TIN" should be -- TiN --;

At column 20, line 5, "lust" should be -- just --;

At column 26, line 26, "(Vref))" should be -- (Vref) --;

At column 26, line 29, "node a" should be -- node α --.

Signed and Sealed this
Nineteenth Day of November, 2013

Teresa Stanek Rea
*Deputy Director of the United States Patent and Trademark Office*